United States Patent [19]

Katoh et al.

[11] Patent Number: 5,336,909
[45] Date of Patent: Aug. 9, 1994

[54] BIPOLAR TRANSISTOR WITH AN IMPROVED COLLECTOR STRUCTURE

[75] Inventors: Riichi Katoh; Kunio Tsuda, both of Yokohama, Japan

[73] Assignee: Kabushiki Kaisha Toshiba, Kawasaki, Japan

[21] Appl. No.: 929,524

[22] Filed: Aug. 14, 1992

[30] Foreign Application Priority Data

Aug. 16, 1991 [JP] Japan .................................. 3-205949
Nov. 7, 1991 [JP] Japan .................................. 3-291562

[51] Int. Cl.$^5$ .................. H01L 31/072; H01L 31/109; H01L 27/082; H01L 27/102
[52] U.S. Cl. .................................. 257/197; 257/198; 257/593; 257/592
[58] Field of Search ............... 257/656, 197, 198, 593, 257/592

[56] References Cited

U.S. PATENT DOCUMENTS

| | | | |
|---|---|---|---|
| 3,607,468 | 9/1971 | Chang et al. | 257/656 |
| 3,709,746 | 1/1973 | De Witt | 257/593 |
| 4,644,383 | 2/1987 | Akcasu | 257/593 |
| 4,933,732 | 6/1990 | Katoh et al. | 257/197 |

FOREIGN PATENT DOCUMENTS 61-53768 3/1986 Japan .
64-53453 3/1989 Japan .

*Primary Examiner*—William Mintel
*Assistant Examiner*—Wael Fahmy
*Attorney, Agent, or Firm*—Oblon, Spivak, McClelland, Maier & Neustadt

[57] ABSTRACT

In a very high speed bipolar transistor, an n+-type GaAs collector layer and an n-type GaAs collector layer are stacked in an intrinsic transistor region, and an i-type GaAs collector layer is formed around the n+-type GaAs collector layer and the n-type GaAs collector layer. An n-type GaAs collector layer is formed on the n+-type GaAs collector layer such that a part of the n-type GaAs collector layer extends on the i-type GaAs collector layer. A p-type GaAs external base layer is formed outside the n-type GaAs collector layer. A p+-type Al$_x$Ga$_{1-x}$As base layer is formed on the n-type GaAs collector layer. An emitter layer is formed such that it is arranged only in the intrinsic transistor region on the p+-type Al$_x$Ga$_{1-x}$As base layer and constitutes a heterojunction together with the base layer. Design trade-off between the cutoff frequency and maximum oscillation frequency of the transistor is eliminated.

16 Claims, 23 Drawing Sheets

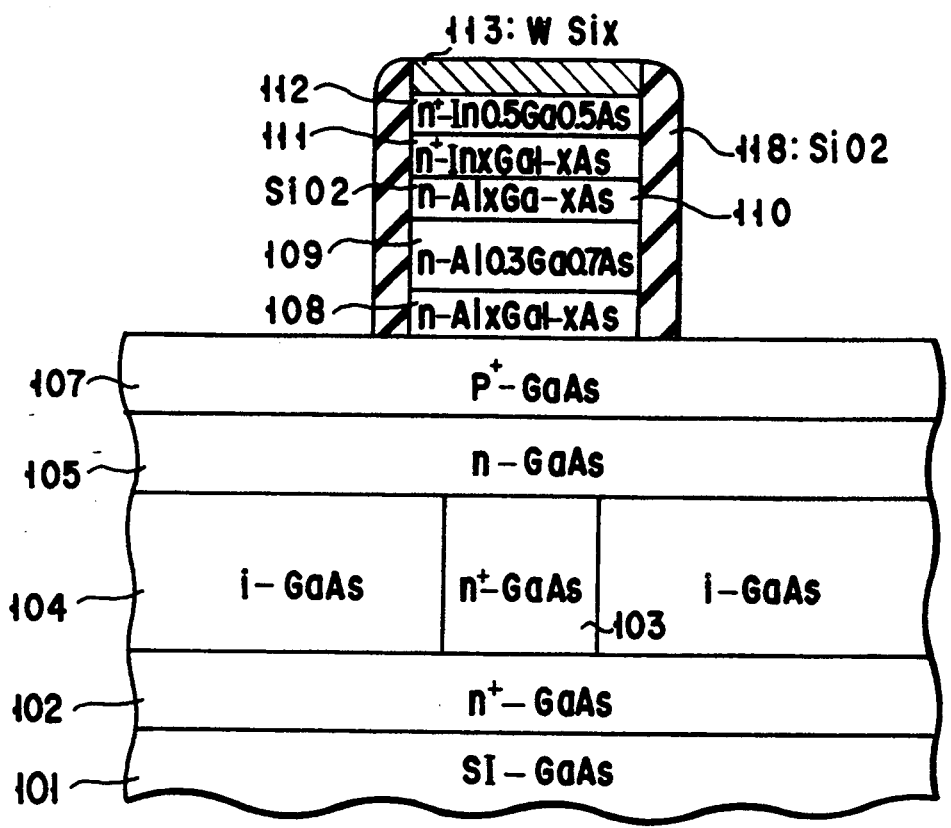
F I G. 2D
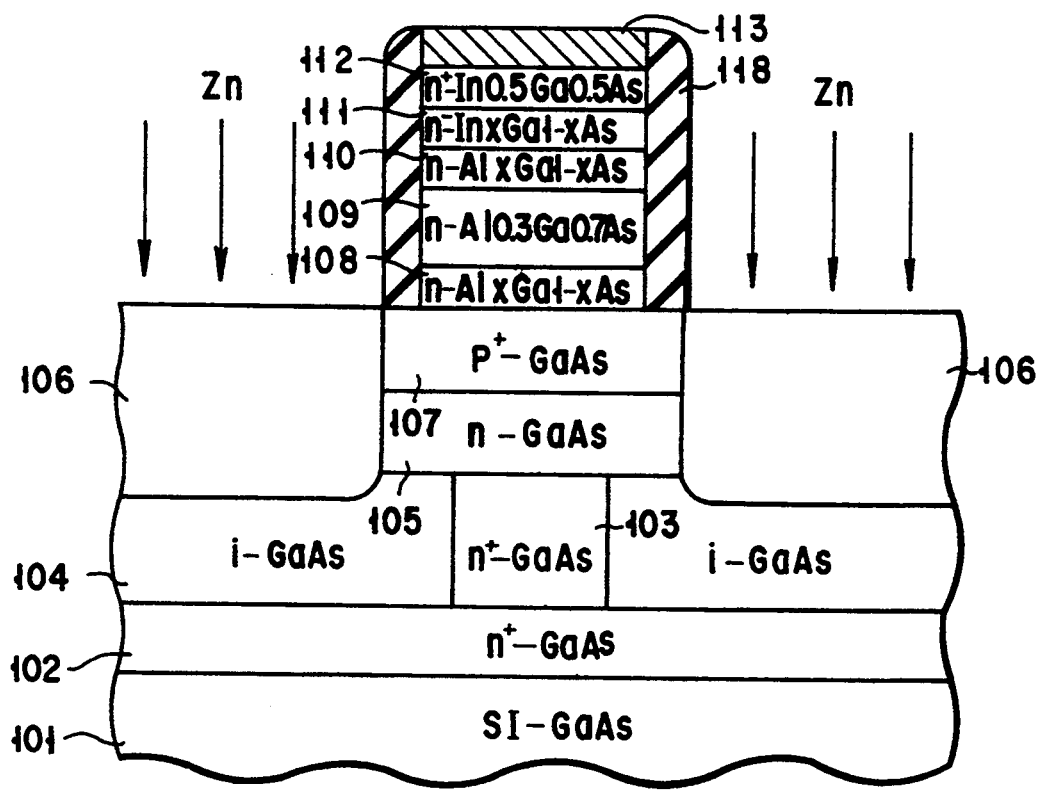
F I G. 2E

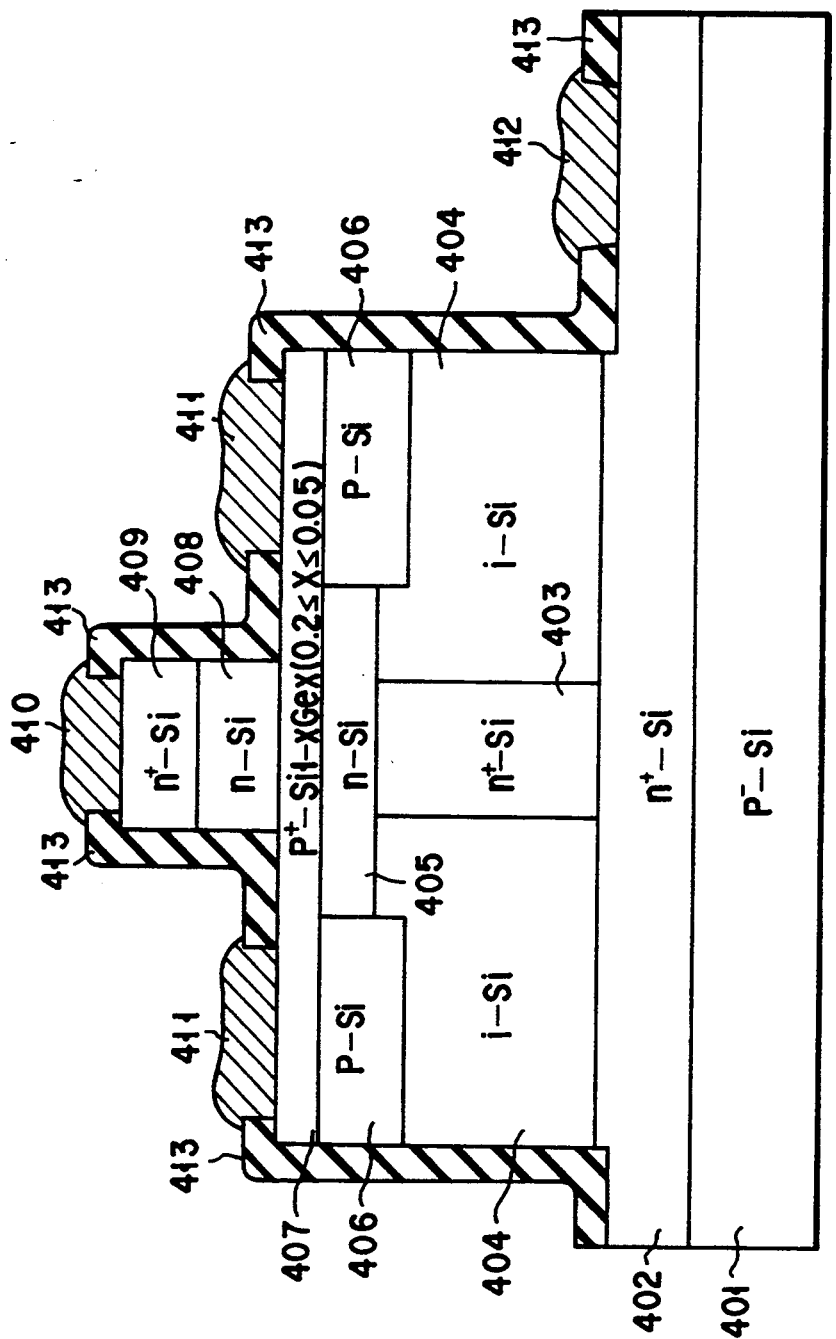
F I G. 5

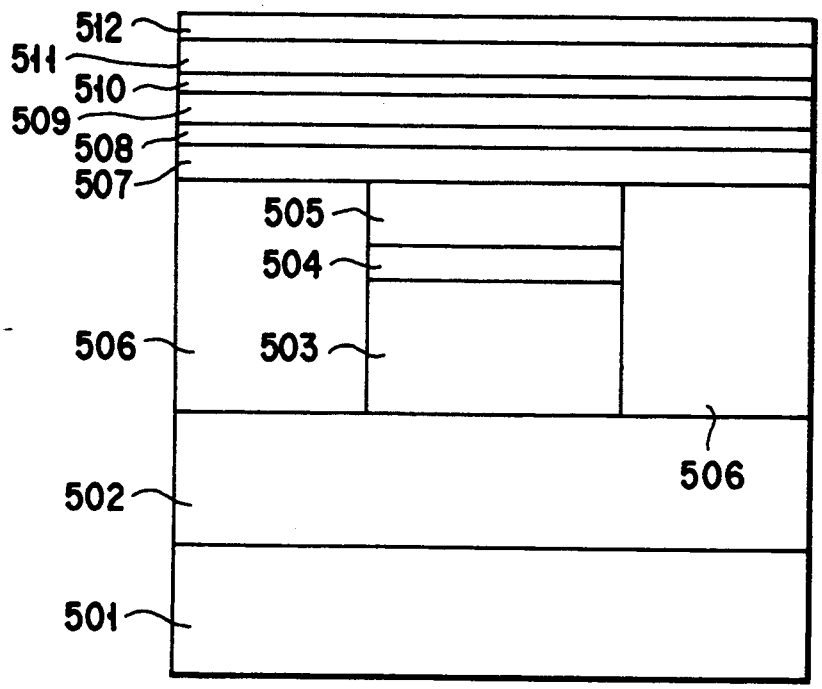
F I G. 7C
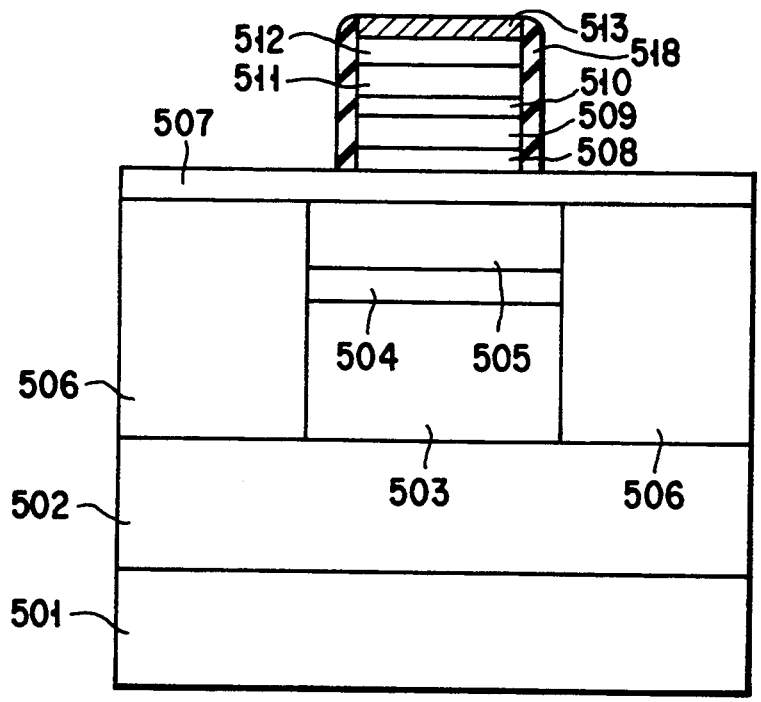
F I G. 7D

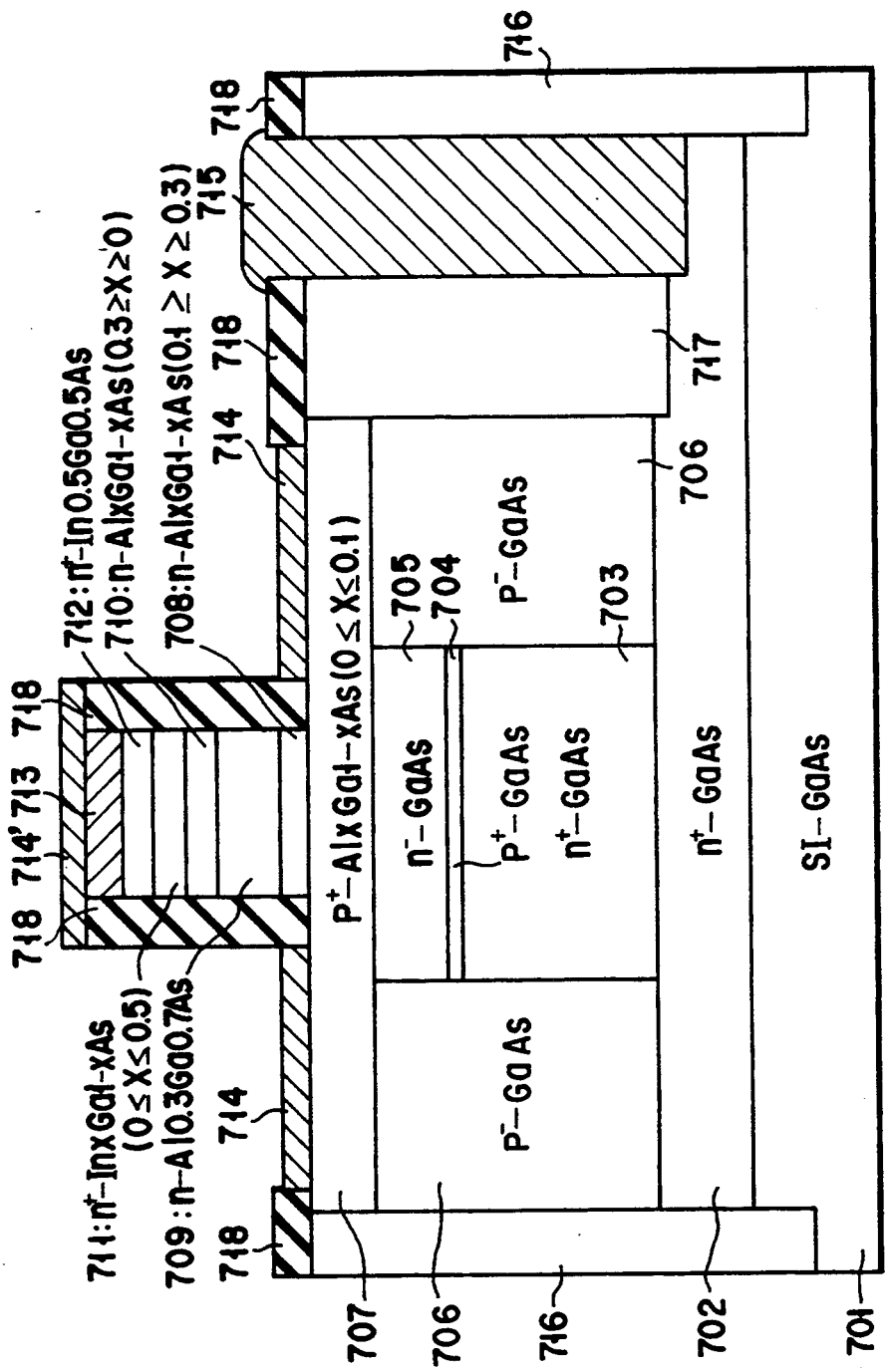
F I G. 9

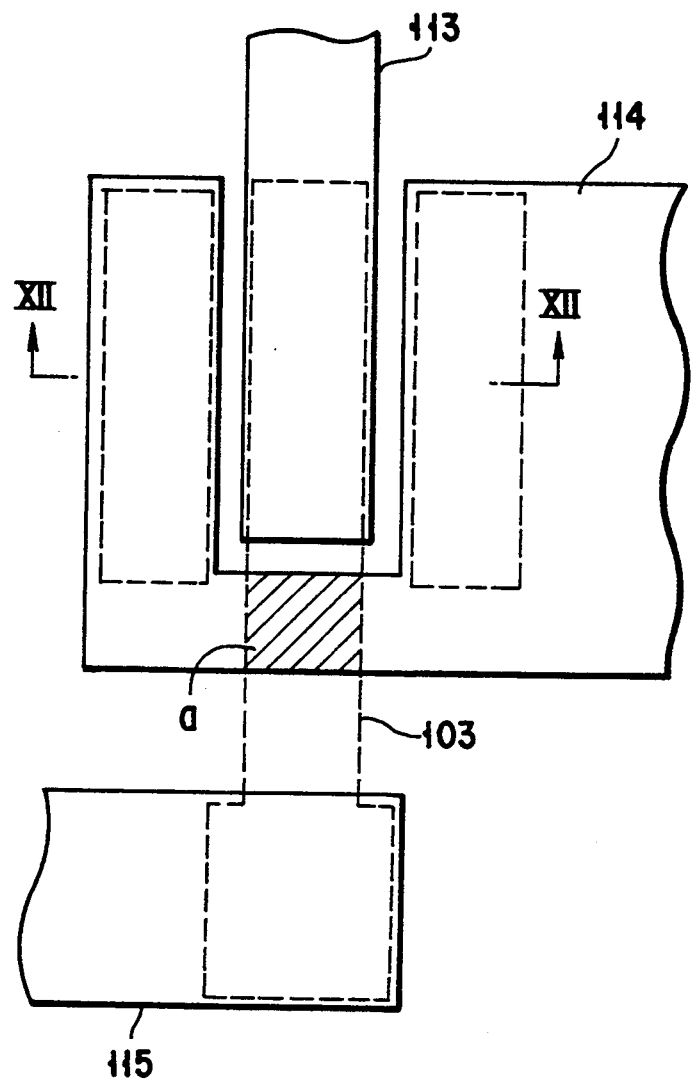
F I G. 13

BIPOLAR TRANSISTOR WITH AN IMPROVED COLLECTOR STRUCTURE

BACKGROUND OF THE INVENTION

1. Field of the Invention

The present invention relates to a very high speed bipolar transistor.

2. Description of the Related Art

When a micropatterned bipolar transistor is operated at a high current density, excellent high-frequency characteristics or excellent switching characteristics can be obtained. For this reason, the bipolar transistor is used as a microwave transistor or a high-speed logic transistor. In order to obtain a high-speed bipolar transistor, various parameters are set such that a cutoff frequency $f_T$ or a maximum oscillation frequency $f_{MAX}$ serving as indices representing the high-speed characteristics of the bipolar transistor. The $f_T$ and $f_{MAX}$ are given by:

$$f_T = \tfrac{1}{2}\pi(\tau_E + \tau_B + \tau_C)$$

$$f_{MAX} = (f_T / 8\pi R_B C_C)^{\tfrac{1}{2}}$$

where $\tau_E$, $\tau_B$, and $\tau_C$ represent an emitter charging time, a base transit time, and collector transit time, respectively, and $R_B$ and $C_C$ represent a base resistance and a collector junction capacitance.

As is apparent from the above equations, various time constants are set to be small to increase the $f_T$, and the $f_T$ is increased and $R_B$ and $C_C$ are decreased to increase the $f_{MAX}$. However, when the thicknesses of a base layer and a collector depletion layer are represented by $W_B$ and $W_{CDEP}$, respectively, and proportional constants are represented by a1, a2, a3, and a4, the following relationships are obtained:

$$\tau_B = a1 W_B, \quad R_B = a2/W_B$$

$$\tau_C = a3 W_{CDEP}, \quad C_C = a4/W_{CDEP}$$

For this reason, when the thickness of the base layer is to be decreased to shorten a base transit time, a base resistance is increased, and the $f_{MAX}$ is decreased. When the thickness of the collector depletion layer is to be decreased to shorten the collector transit time, the collector junction capacitance is increased, and the $f_{MAX}$ is decreased. As a result, it is understood that the $f_T$ and $f_{MAX}$ are traded off.

In the above trade-off relationships, trade-off related to the base layer can be relieved by a heterojunction. When a material having a forbidden band wider than that of the base layer is used for the emitter layer, since a potential barrier of majority carriers in the base with respect to the emitter layer is higher than that of a potential barrier of majority carriers in the emitter with respect to the base layer, the impurity concentration of the base layer can be increased without a decrease in emitter injection efficiency.

By virtue of this, the thickness of the base layer can be decreased without an increase in base resistance in order to shorten a base transit time. The transistor with the above structure is called a heterojunction bipolar transistor, and transistor samples have been actually manufactured by hetero materials such as AlGaAs/GaAs, InP/InGaAs, and SiGe/Si. In these transistors, large current amplification factors and high frequencies $f_T$ and $f_{MAX}$ are obtained.

Trade-off related to the collector layer is complicated compared with the trade-off of the base layer. FIG. 18 is a sectional view showing a typical silicon homojunction bipolar transistor manufactured by a conventional epitaxial growth method (e.g., J. N. Burghartz et al., International Electron Devices Meeting, Technical Digest, 9. 3, 1989).

In FIG. 18, an n$^+$-type silicon layer 925, a p$^+$-type silicon layer 924, an n$^-$-type silicon layer 923, and an n$^+$-type silicon layer 922 are used as an emitter layer, a base layer, a collector layer, and a sub-collector layer, respectively, and these layers are stacked and formed on a p$^-$-type silicon substrate 921 by an epitaxial growth method. The area of the base layer 924 is set to be larger than that of a junction portion between the base layer 924 and the emitter layer 925 to extract a base electrode 927, and thus an external base region having a relatively large area is formed outside an intrinsic transistor region immediately under the emitter layer 925. In FIG. 18, reference numerals 926, 928, and 929 denote an emitter electrode, a collector electrode, and an insulating film, respectively.

In this structure, the external base region immediately under the base electrode 927 is formed by a p-n junction consisting of the base layer 924 and the collector layer 923, and the external base region is operated as a parasitic capacitance in an essential transistor operation. For this reason, the external base region degrades element characteristics, e.g., an increase in $\tau_E$ causes a decrease in $f_T$ and an increase in $R_B C_C$ causes a decrease in $f_{MAX}$. In addition, as described above, when the width of a collector depletion layer is decreased by increasing the impurity concentration of the collector layer 923 to decrease the $\tau_C$, an increase in $C_C$ causes a decrease in $f_{MAX}$.

During a high collector injection, a collector impurity concentration is preferably set to be high to suppress a base push-out effect. However, the impurity concentration of the intrinsic transistor region in which carriers serving as a current flows must be increased, and the impurity concentration of the external base region is preferably set to be low to decrease the collector junction capacitance. For this reason, in the element structure in FIG. 18, it is very difficult to independently optimize the intrinsic region and the external base region.

There is a transistor in which the above difficulty is attempted to be solved (e.g., Katoh et al., Published Unexamined Japanese Patent Application No. 63-147374). This transistor is shown in FIG. 19. The transistor is constituted by a wafer obtained by sequentially stacking and forming an n$^+$-type GaAs layer 932, an n-type GaAs layer 933, a p-type GaAs layer 934, a p$^+$-type Al$_x$Ga$_{1-x}$As layer 936, an n-type Al$_x$Ga$_{1-x}$As layer 937, an n-type Al$_{0.3}$Ga$_{0.7}$As layer 938, an n-type Al$_x$Ga$_{1-x}$As layer 939, and an n$^+$-type GaAs layer 940 on a semi-insulating GaAs substrate 931.

The Al$_x$Ga$_{1-x}$As layers 936, 937, and 939 are regions in which Al composition ratios x are spatially changed, i.e., the ratios x are changed within ranges of $0 \leq x \leq 0.1$, $0.1 \leq x \leq 0.3$, and $0.3 \geq x \geq 0$ from the substrate side. A high resistance layer 935 is formed by implanting B ions or the like outside the intrinsic transistor region consisting of the n-type GaAs layer 933 and the p-type GaAs layer 934. In addition, reference numerals 941, 942, 943, and 944 denote an emitter electrode, a base electrode, a collector electrode, and an insulating film, respectively.

In this transistor, the n-type $Al_xGa_{1-x}As$ layer 937 to the n+-type GaAs layer 940 serve as an emitter, the p+-type $Al_xGa_{1-x}As$ layer 936 serves as a base, the n-type GaAs layer 933 and the p-type GaAs layer 934 serve as a collector, and the n+-type GaAs layer 932 serves as a sub-collector. In this case, the p-type GaAs layer 934 is called a p-type collector, and it effectively enhances a velocity overshoot effect which considerably appears in a compound semiconductor such as GaAs to increase an electron velocity in the collector.

When the impurity concentration of the p-type collector layer 934 is set to be lower than that of the n-type collector layer, a collector transit time and a collector junction capacitance in the intrinsic transistor region can be simultaneously decreased. In addition, since the external base region has a high resistance, an increase in collector junction capacitance caused by the external base region can be suppressed to be small. Therefore, very high $f_T$ and $f_{MAX}$ must be obtained.

Although p- and n-type concentrations must be increased to some extent in an actual collector, an impurity concentration and a depth of a high resistant portion formed by ion implantation are limited. For this reason, the high performance of the transistor is limited.

There is another transistor in which the above difficulty is attempted to be solved (e.g., Katoh, Published Unexamined Japanese Patent Application No. 59-184132). This transistor is shown in FIG. 20. The transistor is obtained by developing the prior art in FIG. 18. In FIG. 20, an n+-type silicon layer 951 is formed as a collector layer of an intrinsic transistor portion, and a p+-type external base layer 952 is formed outside the n+-type silicon layer 951.

In this structure, an n−-type collector layer 923 is entirely formed under the n+-type collector layer 951 and the p+-type external base layer 952 such that the collector junction capacitance in an external base region is suppressed to be low. On the other hand, since the n+-type collector layer 951 in an intrinsic collector region has a high concentration, its depletion layer has a small width, and a collector transit time is shortened. The n+-type collector layer 951 having a high concentration also suppresses a base push-out effect during a high collector injection.

However, since electrons passing through the high-concentration n+-type collector layer 951 flow in an n+-type sub-collector layer 922, the electrons pass through the low-concentration n−-type collector layer 923. As a result, a high injection effect occurs.

In addition, when ions are implanted in materials such as Si and InGaAs having a narrow forbidden band, the resistances of the materials cannot be effectively increased. Therefore, when collector junction capacitance caused by an external base is to be decreased, the impurity concentration of the entire area of the collector must be set to be low in advance.

Still another conventional AlGaAs/GaAs heterojunction bipolar transistor is shown in FIG. 21 (Ishibashi et al., Published Unexamined Japanese Patent Application No. 64-53453). This transistor is manufactured using a wafer obtained by subsequently and epitaxial growing semiconductor layers on a semi-insulating GaAs substrate 961 by an epitaxial growth method such as molecular beam epitaxy (MBE) and a metalorganic chemical vapor deposition (MOCVD) method. An n+-type GaAs layer 962 serving as a sub-collector, a p+-type GaAs layer 963 and i-type GaAs layer 964 which serve as a collector, and a p+-type $Al_xGa_{1-x}As$ layer 965 serving as a base are sequentially stacked and formed on a GaAs substrate 961.

In the p+-type $Al_xGa_{1-x}As$ layer 965, in order to form an acceleration electric field obtained such that electrons injected from the emitter to the base rapidly flow in the collector, an Al composition ratio x is set to be gradually decreased from 0.15 to 0 from the emitter side. An n-type $Al_xGa_{1-x}As$ layer 966, an n-type $Al_{0.3}Ga_{0.7}As$ layer 967, and an n-type $Al_xGa_{1-x}As$ layer 968 which serve as emitter, and an $In_xGa_{1-x}As$ layer 969 and an $In_xGa_{1-x}As$ layer 970 which serve as an emitter cap are sequentially stacked and formed on the base layer. In this case, the n-type $Al_xGa_{1-x}As$ layers 966 and 968 and the $In_xGa_{1-x}As$ layer 969 are layers for smoothly connecting conduction bands. The values x of these layers are set to be $0.15 \leq X < 0.3$, $0.3 \geq X \geq 0$, and $0 \leq X \leq 0.5$ from the base side, respectively. The p+-type GaAs collector layer 963 is almost depleted, and its thickness is set to be very small so as not to form a potential barrier against electrons flowing from the base. Reference numerals 971, 972, 973, and 976 denote an emitter electrode, a base electrode, a collector electrode, and an insulating layer, respectively. In addition, reference numerals 974 and 975 denote isolation regions formed by implanting H+ions.

With the above element structure, since the diffusion potential of the collector region can be set to be a potential between the potentials of the p+-type GaAs collector layer 963 and the n+-type collector layer 962, an electric field in the i-type collector layer 964 is relaxed compared with a normal n-type collector. Therefore, since electrons injected from the base layer 965 to the collector layer 964 can stay in a Γ band in almost the entire area of the collector region, an electron velocity in the collector can be remarkably increased. That is, since a collector transit time of the electrons can be minimized, a very large cutoff frequency $f_T$ can be obtained. In addition, since the i-type collector layer 964 is depleted, a collector junction capacitance including the external base region immediately under the base electrode 972 is determined by the thickness of the i-type collector layer 964. When the thickness is set to be large to some extent, since the collector junction capacitance can be sufficiently minimized, the maximum oscillation frequency $f_{MAX}$ must be increased.

In this conventional transistor, however, since the collector transit time and the collector junction capacitance are traded off with respect to the thickness of i-type collector layer, when the high $f_T$ is to be obtained, the $f_{MAX}$ cannot be greatly increased.

As described above, in collector structures of conventional bipolar transistors, a decrease in collector transit time and a decrease in collector junction capacitance are traded off. More specifically, when a material having a small forbidden band width is used for a collector region, a countermeasure, e.g., an increase in resistance by ion implantation, is not effective to decrease the collector junction capacitance in an external base region serving as a parasitic capacitance. For this reason, the impurity concentration of a collector layer must be decreased to decrease the parasitic capacitance. However, when the impurity concentration of the collector layer is set to be low, since a collector depletion layer extends in an intrinsic collector, a collector transit time is increased. In addition, in a low-concentration collector, during a high collector injection, an element operation is slowed by a base push-out effect.

SUMMARY OF THE INVENTION

The present invention has been made in consideration of the above circumstances, and has as its object to provide a very high speed bipolar transistor in which a trade-off relationship between a collector transit time and a collector junction capacitance is eliminated, and an element structure capable of minimizing the collector transit time and the collector junction capacitance can simultaneously obtain a high cutoff frequency and a high maximum oscillation frequency.

According to the present invention, there is provided a bipolar transistor comprising a substrate, a first collector layer of a first conductivity type formed in an intrinsic transistor region on the substrate and having a high carrier concentration, a second collector layer formed on the first collector layer, a third collector layer having a high resistance and formed outside the first collector layer, a collector electrode connected to the first collector layer, a base layer of a second conductivity type formed to extend from the second collector layer to the third collector layer, a base electrode connected to the base layer, an emitter layer of the first conductivity type formed only in the intrinsic transistor region on the base layer, and an emitter electrode connected to the emitter layer.

In this case, the intrinsic transistor region represents a region which is defined by the emitter region and substantially contributes to a transistor operation. Although an undoped intrinsic semiconductor layer (i-type layer) is preferably used as the third collector layer having a high resistance formed around the intrinsic transistor region, the third collector layer can be a high-resistance layer which has a very low impurity concentration and is substantially perfectly depleted during an operation time of the transistor regardless of a conductivity type, i.e., an n or p type.

In the bipolar transistor of the present invention, it is useful to insert a fourth collector layer of the second conductivity type on the base side of the second collector layer of the intrinsic transistor region or on the first collector layer side, thereby obtaining the carrier velocity overshoot effect.

In the bipolar transistor of the present invention, it is effective that a layer of the second conductivity type having a concentration lower than the internal base region is formed in the external base region to be in contact with the third collector layer and to be separated from the first collector layer.

In addition, it is also effective that a bipolar transistor according to the present invention is a heterojunction bipolar transistor consisting of a semiconductor material having a forbidden band width of the emitter region larger than that of the base region.

According to a bipolar transistor according to the present invention, the structure under the intrinsic transistor region and the external base region can be independently optimized. That is, since the intrinsic transistor region is basically formed by a stacked structure consisting of a high-concentration first collector layer and a second collector layer having a concentration lower than that of the first collector layer, a collector transit time is short, and a high collector injection effect does not easily occur. Under the external base region, the third collector layer which has a concentration sufficiently lower than that of the second collector layer and is perfectly depleted during an operation time of the transistor is formed, and an increase in collector junction capacitance caused by the external base can be sufficiently minimized.

More specifically, since the layer of the second conductivity type having a concentration lower than that of the internal base region is formed in the external base region to be in contact with the third collector layer and to be separated from the first collector layer, the collector junction capacitance can be further minimized.

As described above, in the bipolar transistor of the present invention, a very high cutoff frequency $f_T$ and a very high maximum oscillation frequency $f_{MAX}$ can be simultaneously obtained.

In addition, in an npn transistor, when a second collector layer in an intrinsic transistor region is not of an i-type but an $n^-$-type to be perfectly depleted, since a positive space charge is formed, a high injection effect is suppressed compared with an i-type layer. When a third collector layer in an external base region is not of an i-type but a $p^-$-type to be perfectly depleted, the position of a conduction band is lifted with respect to electrons compared with the i-type layer. Even if electrons injected from the base to the collector enter in the external base region, the electrons can be rapidly collected in the intrinsic collector region.

In the npn transistor, when a p-type fourth collector layer is inserted in the intrinsic transistor region, and the impurity concentration and thickness of the fourth collector layer are set to be appropriate values, inclination of a band in which electrons in the second layer rarely transit from a r band to an $\Gamma$ band can be obtained. For this reason, a carrier velocity is overshot in almost the entire area of the second collector layer, and a collector transit time can be minimized.

In a bipolar transistor according to the present invention, when an npn transistor is exemplified, an $n^+$-type layer which has a small thickness and can be depleted may be formed between a $p^+$-type base layer and a collector layer, and a p-type layer under the $p^+$-type base layer may be formed in the external base region. An $n^+$-type layer under the $p^+$-type base layer in the intrinsic base region serves as a source of electrons, and the collector junction capacitance of the external base region is determined by the thickness of a remaining i-type layer. Therefore, the intrinsic base region and the external base region can be independently optimized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2E are sectional views showing the steps in manufacturing the heterojunction bipolar transistor of the first embodiment;

FIG. 5 is a sectional view showing a heterojunction bipolar transistor according to the fourth embodiment of the present invention;

FIGS. 7A to 7D are sectional views showing the steps in manufacturing the heterojunction bipolar transistor of the fifth embodiment;

FIG. 9 is a sectional view showing a heterojunction bipolar transistor according to the seventh embodiment of the present invention;

FIG. 13 shows the layout of a collector electrode extraction structure in the tenth embodiment;

DETAILED DESCRIPTION OF THE PREFERRED EMBODIMENTS

Embodiments of the present invention will be described below.

Figure 1:
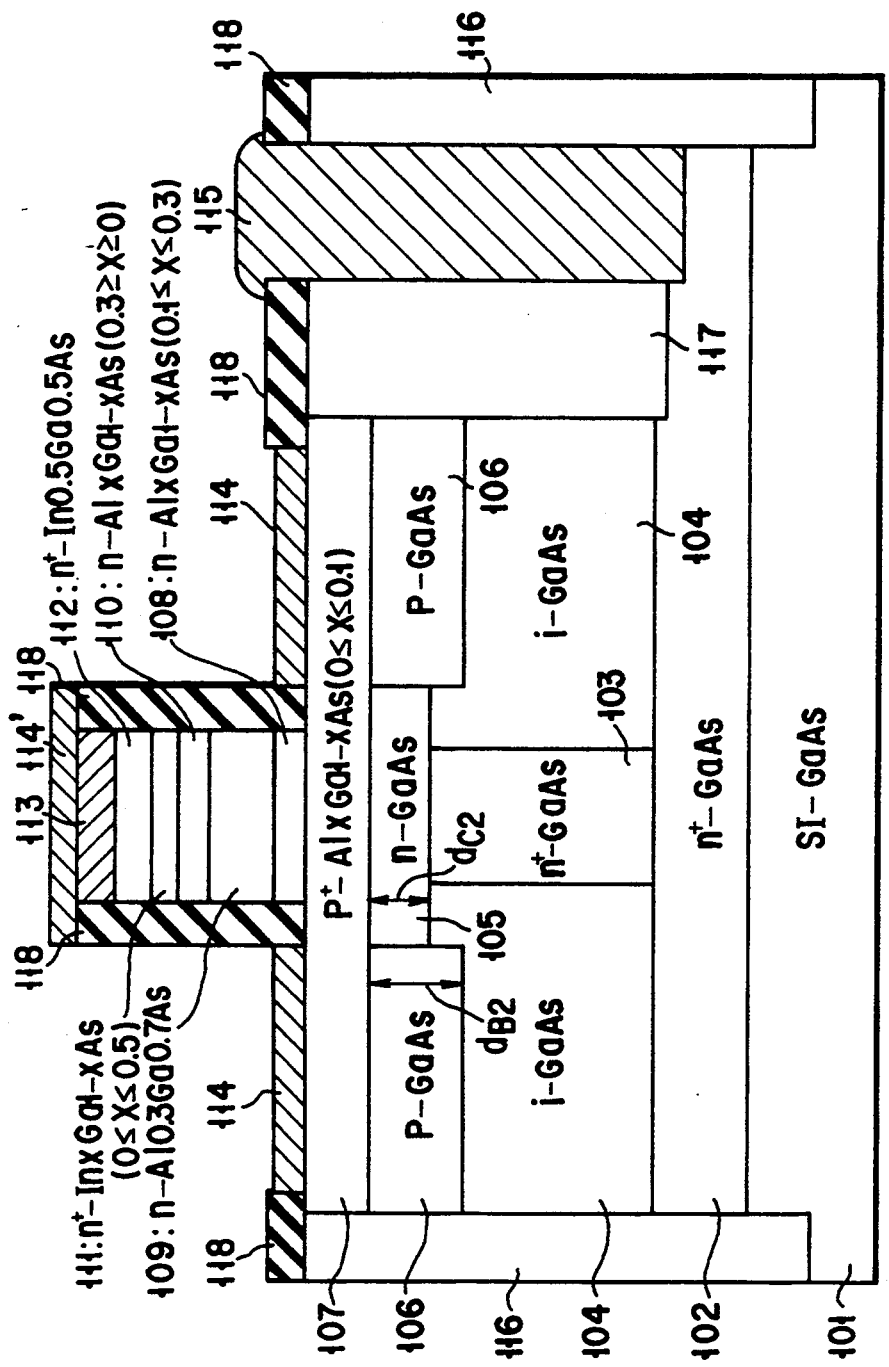
FIG. 1 is a sectional view showing a heterojunction bipolar transistor according to the first embodiment of the present invention.

FIG. 1 is a sectional view showing a heterojunction bipolar transistor using an AlGaAs/GaAs material according to the first embodiment of the present invention. An n-type collector layer, a p-type base layer, and an n-type emitter layer are sequentially formed on a semi-insulating GaAs substrate 101 through n+-type GaAs sub-collector layer 102. The collector layer consists of a high-concentration n+-type GaAs collector layer (first collector layer) 103 formed in an intrinsic transistor region, an n-type GaAs collector layer (second collector layer) 105 formed on the first collector layer and having a concentration lower than that of the first collector layer, and an i-type GaAs collector layer (third collector layer) 104 formed outside the first and second collector layers.

A p+-type AlGaAs base layer 107 is formed on the collector layer. The AlGaAs base layer 107 is formed to extend from the internal base region to the external base region, and a p-type GaAs layer 106 having a concentration lower than that of the AlGaAs base layer 107 is formed in the external base region. The p-type GaAs layer 106 whose side surface is in contact with the n-type GaAs collector layer 105 and whose bottom surface is in contact with the i-type GaAs collector layer 104 is formed to be separated from the high-concentration n+-type GaAs collector layer 103.

An n-type emitter layer is locally projected in the intrinsic transistor region on the base layer. The emitter layer consists of an n-type $Al_xGa_{1-x}As$ layer ($0.1 \leq x \leq 0.3$) 108 serving as a bandgap transition layer, an n-type $Al_{0.3}Ga_{0.7}As$ layer 109, an n-type $Al_xGa_{1-x}As$ layer ($0.3 \geq x \geq 0$) 110 serving as a bandgap transition layer, an n+-type $In_xGa_{1-x}As$ layer ($0 \leq x \leq 0.5$) 111, and an n+-type $In_{0.5}Ga_{0.5}As$ layer 112. The layers 111 and 112 serve as an emitter-cap layer.

In order to manufacture the heterojunction bipolar transistor, selective epitaxial growth must be performed. As a growth method, a metalorganic chemical vapor deposition method (MOCVD method) or a gas source molecular beam epitaxy method (GSMBE/CBE) is preferably used. In this embodiment, the MOCVD method is used.

Figure 2A:
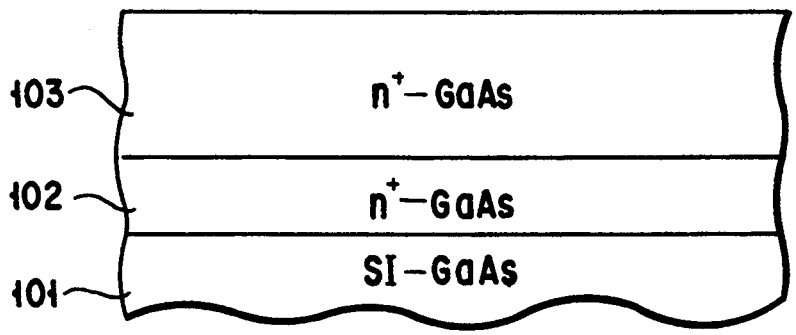
Figure 2B:
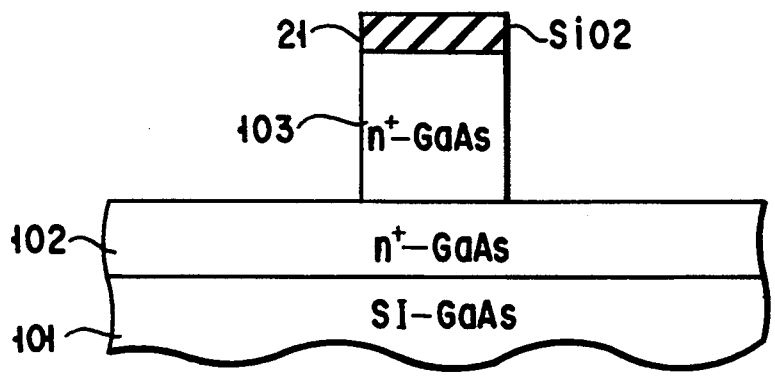

The steps in manufacturing the heterojunction bipolar transistor will be described below with reference to FIGS. 2A to 2E. An n+-type GaAs sub-collector layer 102 having an impurity concentration of $5 \times 10^{18}$ cm$^{-3}$ and a thickness of 500 nm, and an n+-type GaAs collector layer 103 having a thickness of 1,000 nm are grown on the semi-insulating GaAs substrate 101 (FIG. 2A). An SiO$_2$ film 21 is deposited on the resultant structure by a CVD method, and the SiO$_2$ film 21 is removed except for the region of the n+-type collector 103 using a photoresist as a mask. Using this SiO$_2$ pattern as a mask, anisotropic etching using RIE is performed to reach the n+-type GaAs sub-collector layer 102 so as to remove an excessive part of the n+-type GaAs collector layer 103 (FIG. 2B). In this manner, the n+-type GaAs collector layer 103 which is patterned in the intrinsic transistor region is the first collector layer.

Thereafter, the i-type GaAs collector layer 104 which prospectively serves as the third collector layer under the external base region and is not doped with an impurity is selectively grown using the SiO$_2$ film 21 as a mask to have a thickness of 1,000 nm. After the SiO$_2$ film 21 is removed, the n-type GaAs collector layer 105 serving as the second collector layer and having an impurity concentration of $1 \times 10^{17}$ cm$^{-3}$ and a thickness of 200 nm is formed on the entire surface of the resultant structure, and the p+-type $Al_xGa_{1-x}As$ layer base layer 107 having an impurity concentration of $1 \times 10^{20}$ cm$^{-3}$ and a thickness of 50 nm is grown on the GaAs collector layer 105. At this time, the Al composition ratio x is gradually changed from 0 to 0.1 from the collector layer 105 side. In this manner, an acceleration electric field for electrons flowing in the base can be continuously generated. A uniform base structure in which the ratio x is not changed can be formed as a matter of course.

Figure 2C:
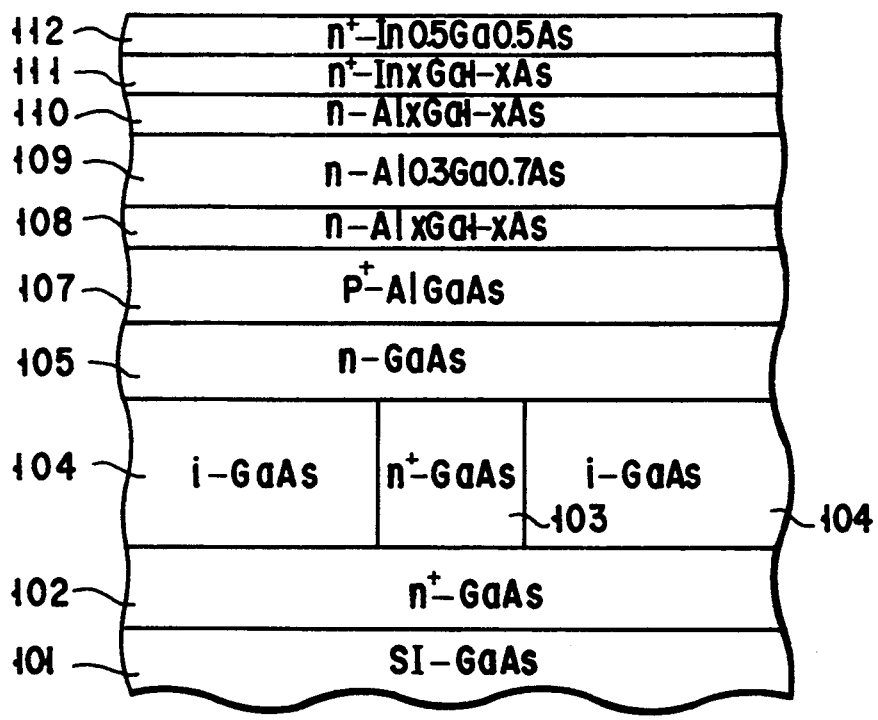

An n-type $Al_xGa_{1-x}As$ layer 108, an n-type $Al_{0.3}Ga_{0.7}As$ layer 109, and the n-type $Al_xGa_{1-x}As$ layer 110 are sequentially grown to form the emitter layer. In this case, since the shape of a conduction band must be smoothly changed to cause electrons to flow, a ratio x in the n-type layer 108 is gradually changed from 0.1 to 0.3 from the base layer 107 side, and a ratio x in the n-type layer 109 is gradually changed from 0.3 to 0. The n+-type $In_xGa_{1-x}As$ layer 111 and the n+-type $In_{0.5}Ga_{0.5}As$ layer 112 are sequentially grown to form the cap layer (FIG. 2C). In this case, in order to smoothly change the shape of the conduction band, an In composition ratio x in the n+-type layer 111 is gradually changed from 0 to 0.5 from the emitter side.

Thereafter, a $WSi_x$ film is deposited by a CVD method and selectively etched by RIE using a photoresist as a mask to form an emitter electrode 113. Anisotropic etching is performed to the semiconductor layer to reach the p+-type AlGaAs base layer 107 to remove an excessive part of the semiconductor layer except for a part required for the emitter region (intrinsic transistor region). An $SiO_2$ film 118 is deposited using a plasma CVD method to have a thickness of 300 nm and anisotropically etched using RIE (FIG. 2D).

Zn is diffused by an open-tube method using $ZnAs_2$ to form the p-type GaAs layer 106 in the external base region (FIG. 2E). After an opening is formed in the base-collector junction region using a photoresist as a mask, Cr/Au is deposited, and a base electrode 114 is formed by lift-off. At the same time, a Cr/Au electrode 114' is formed on the emitter electrode 113. Isolation regions 116 and 117 are formed by H+ion implantation using the photoresist and the $SiO_2$ film as masks, and a collector electrode 115 is formed using AuGe/Ni/Ti/Au, thereby obtaining the bipolar transistor of the present invention.

According to this embodiment, the emitter electrode 113 and the base electrode 114 are self-aligned by an $SiO_2$ film 118 formed on the side wall of the emitter region, thereby obtaining a micropatterned emitter. In addition, the area of the n-type collector layer 105 is larger than the emitter area by the thickness of the $SiO_2$ film 118, and the n-type collector layer 105 is self-aligned. The area of the n+-type collector layer 103 is set to be smaller than that of the n-type collector layer 105. Therefore, the p-type GaAs layer 106 in the external base region is separated from the n+-type collector layer 103.

In the bipolar transistor according to the first embodiment, the n+-type GaAs collector layer 103 serving as the first collector layer in the intrinsic transistor region and the p-type GaAs layer 106 in the external base region are formed to be separated from each other. Border lines between the n-type GaAs collector layer 105 serving as the second collector layer and the p+-type AlGaAs base layer 107 serving as an intrinsic base, and between the p-type GaAs layer 106 and the p+-type AlGaAs base layer 107 are formed on the same plane parallel to the substrate. When the areas of the planes of the n+-type GaAs collector layer 103, the n-type GaAs collector layer 105, and the emitter layer 108 which are parallel to the substrate are represented by $S_{C1}$, $S_{C2}$, and $S_E$, respectively, conditions of $$S_{C1} < S_{C2} \text{ and } S_{C2} > S_E$$

are satisfied, and the emitter layer is located inside the n-type collector layer 105. When the impurity concentrations of the n+-type GaAs collector layer 103 and the n-type GaAs collector layer 105 are represented by $N_{C1}$ and $N_{C2}$, respectively, a condition of $$N_{C1} \geq N_{C2}$$

is satisfied. In addition, the thicknesses of the n-type GaAs collector layer 105 serving as the second collector and the P-type GaAs base layer 106 are represented by $d_{C2}$ and $d_{B2}$, respectively, a condition of $$d_{C2} \leq d_{B2}$$

is satisfied.

The heterojunction bipolar transistor according to the first embodiment does not perfectly deplete the n-type collector layer 105 in an operating state and can be optimally designed to obtain a desired current density. That is, the n-type collector layer 105 is set to have a thickness as small as possible and a concentration as high as possible within a range so as to obtain a required collector breakdown voltage. For this reason, a collector transit time can be shortened, and a base push-out effect can be suppressed. Since electrons passing through the n-type collector layer 105 flow from the n+-type collector layer 103 to the n+-type sub-collector layer 102, a high injection effect can be prevented.

In the structure of the first embodiment, since the thickness of the n-type collector layer 105 and the thickness of the i-type collector layer 104 can be independently set, the capacitance of the external base region which is a large part of a collector junction capacitance can be minimized by sufficiently increasing the thickness of the i-type GaAs layer 104. Therefore, in the structure of this embodiment, since the collector transit time and the collector junction capacitance are minimized, a very high cutoff frequency $f_T$ and a very high maximum oscillation frequency $f_{MAX}$ can be obtained.

The structure of the first embodiment can be obtained by variably modified steps. For example, the n+-type GaAs collector layer 103 may be selectively grown after the i-type GaAs collector layer 104 is grown. The external base layer 106 can be formed by not only Zn diffusion but selective growth or ion implantation. A method of forming the periphery of the emitter and base is not limited to that in this embodiment, various methods can be effected. In addition, the impurity concentrations and thicknesses of the various semiconductor layers may have values other than the values described in this embodiment. More specifically, the i-type collector layer 104 in the external base region may be formed by an n--type low-concentration layer or an AlGaAs layer consisting of a wide forbidden band. After the external base region is formed by an i-type layer, the resistance of the external base region may be increased by ion implantation or the like.

In the first embodiment, an AlGaAs/GaAs heterojunction bipolar transistor has been described above. However, the present invention can be applied to materials such as InP/InGaAs, AlInAs/InGaAs, and Si/SiGe, forming other heterojunctions, and it can be applied to a homojunction bipolar transistor as of Si as a matter of course.

Figure 3:
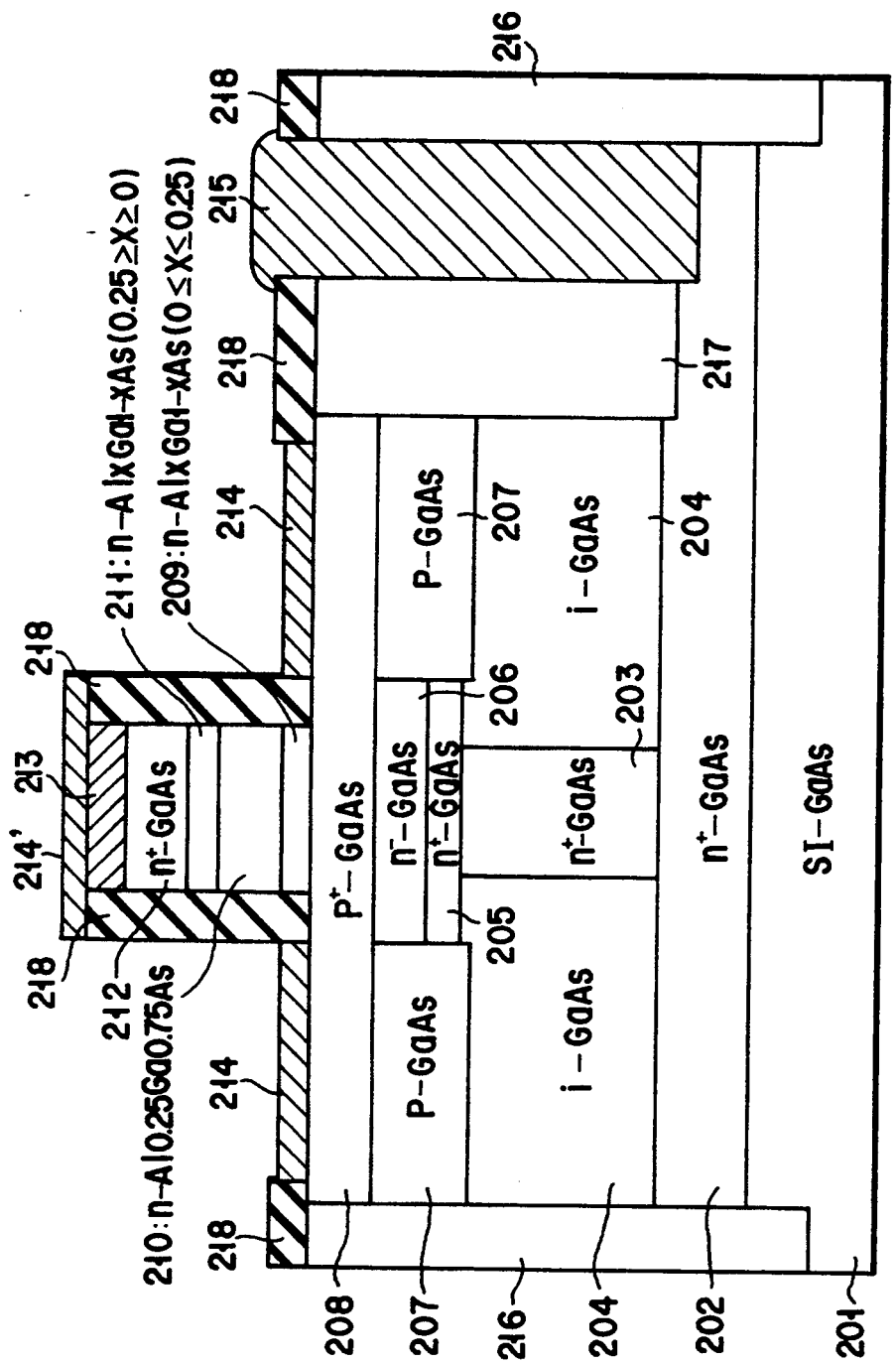
FIG. 3 is a sectional view showing a heterojunction bipolar translator according to the second embodiment of the present invention.

FIG. 3 shows an AlGaAs/GaAs heterojunction bipolar transistor according to the second embodiment of the present invention. This transistor can be manufactured by the same steps as those of the transistor of the first embodiment.

An $n^+$-type GaAs sub-collector layer 202 is formed on a semi-insulating GaAs substrate 201, an $n^+$-type GaAs collector layer 203 is formed in an intrinsic transistor region on the sub-collector layer 202, and an i-type GaAs collector layer 204 is formed outside the $n^+$-type GaAs collector layer 203. In this embodiment, a second collector layer formed on the $n^+$-type GaAs collector layer 203 has a two-layered structure consisting of an $n^+$-type GaAs layer 205 and an n-type GaAs layer 206 having a concentration lower than that of the layer 205. A p-type GaAs external base layer 207 is formed outside the second collector layer, and a $p^+$-type GaAs base layer 208 is formed on the second collector layer.

An emitter layer is constituted by an n-type $Al_xGa_{1-x}As$ layer 209, an n-type $Al_{0.25}Ga_{0.75}As$ layer 210, an n-type $Al_xGa_{1-x}As$ layer 211, and an $n^+$-type GaAs layer 212 serving as an emitter cap layer to have a projection shape in the region of the second collector layer. The n-type $Al_xGa_{1-x}As$ layer 209 and the n-type $Al_xGa_{1-x}As$ layer 211 are bandgap transition layers whose compositions are gradually changed.

An emitter electrode 213, a base electrode 214, and a collector electrode 215 are formed in corresponding element regions, respectively. When the base electrode 214 is formed, a Cr/Au electrode 214' is simultaneously formed on the emitter electrode 213. An element isolation layer 216 and an electrode isolation layer 217 are insulating layers formed by implanting $H^+$ and $B^+$ ions, respectively, and a wafer surface protecting layer 218 is a $CVD-SiO_2$ film.

According to the second embodiment, the same high-speed performance as in the first embodiment can be obtained. In the element structure of the second embodiment, if the $n^-$-type layer 206 in an intrinsic collector region should reach through while being set in a high injection state, since a collector transit time is determined by the thickness of the $n^-$-type layer 206, the collector transit time can be arbitrarily set. In addition, if a base push-out effect occurs in the $n^-$-type layer 206, since injected holes are blocked by the $n^{30}$-type layer 205, the holes do not further degrade transistor characteristics.

Figure 4:
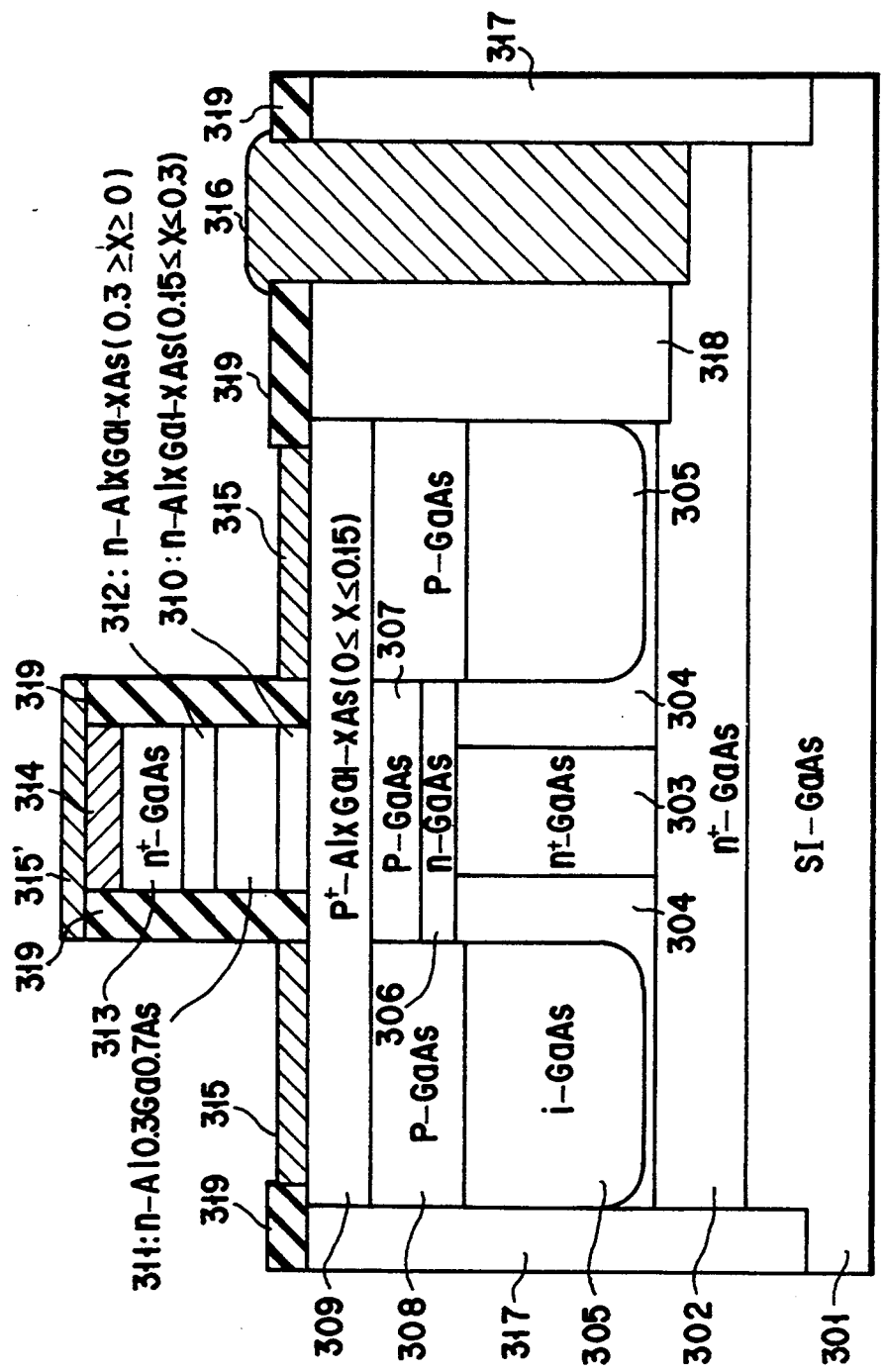
FIG. 4 is a sectional view showing a heterojunction bipolar transistor according to the third embodiment of the present invention.

FIG. 4 shows an AlGaAs/GaAs heterojunction bipolar transistor according to the third embodiment of the present invention. This transistor can also be manufactured by the same steps as those of the first embodiment. In the third embodiment, a p-type GaAs collector layer 307 serving as a fourth collector layer is formed on an n-type GaAs layer 306 serving as a second collector layer.

An $n^+$-type GaAs sub-collector layer 302 is formed on a semi-insulating GaAs substrate 301, an $n^+$-type GaAs collector layer 303 is formed in an intrinsic transistor region on the sub-collector layer 302, and i-type GaAs collector layers 304 and 305 serving as external collector layers are formed outside the $n^+$-type GaAs collector layer 303. The i-type GaAs layer 304 is an i-type layer obtained by only epitaxial growth, and the i-type GaAs layer 305 is an i-type layer whose resistance is increased by implanting oxygen ions.

A two-layered structure consisting of the n-type GaAs layer 306 and the p-type GaAs layer 307 is formed on the $n^+$-type GaAs collector layer 303 such that a part of the structure extends to the external collector region. A p-type GaAs external base layer 308 is formed outside the collector layers. A $p^+$-type $Al_xGa_{1-x}As$ base layer 309 is formed in an intrinsic base region. An n-type $Al_xGa_{1-x}As$ layer 310, an n-type $Al_{0.25}Ga_{0.75}As$ layer 311, an n-type $Al_xGa_{1-x}As$ layer 312 which serve as an emitter layer, and an $n^+$-type GaAs layer 313 serving as an emitter cap layer are formed above the intrinsic base region to have a projection shape.

An emitter electrode 314, a base electrode 315, and a collector electrode 316 are formed. When the base electrode 315 is formed, a Cr/Au electrode 315' is simultaneously formed on the emitter electrode 314. An element isolation layer 317 and an electrode isolation layer 318 are insulating layers formed by implanting $H^+$ and $B^+$ ions, respectively, and a wafer surface protecting layer 319 is a $CVD-SiO_2$ film.

With the above element structure, in an intrinsic transistor portion, a velocity overshoot effect of electrons is effectively used by the p-type collector structure to increase an electron velocity, thereby considerably shortening a collector transit time. In addition, in the external base region, the thickness of the i-type GaAs layer 305 is set to be sufficiently large, and a collector junction capacitance can be minimized. As in the previous embodiments, since the structures of the intrinsic region and the external base region can be independently designed, a very high cutoff frequency $f_T$ and a very high maximum oscillation frequency $f_{MAX}$ can be obtained.

FIG. 5 shows an $Si_{1-x}Ge_x/Si$ heterojunction bipolar transistor according to the fourth embodiment of the present invention. An $n^+$-type Si sub-collector layer 402 is formed on a $p^-$-type Si substrate 401, an $n^+$-type collector layer 403 is formed in an intrinsic transistor region on the layer 402, and an i-type Si collector layer 404 is formed outside the collector layer 403. An n-type Si collector layer 405 is formed on the $n^+$-type Si collector layer 304 such that a part of the layer 405 extends to the i-type Si collector layer 404. A p-type Si external base layer 406 is formed outside the n-type Si collector layer 405, and a $p^+$-type $Si_{1-x}Ge_x$ base layer $(0.2 \leq \times \leq 0.05)$ 407 is formed on the n-type Si collector layer 405 to extend to an external base region.

An n-type Si layer 408 serving as an emitter layer, and an $n^+$-type Si layer 409 serving as an emitter cap layer are formed on the $p^+$-type $Si_{1-x}Ge_x$ base layer 407. An emitter electrode 410, a base electrode 411, and a collector electrode 412 are formed as terminal electrodes, respectively. A surface protecting layer 413 is an $SiO_2$ film.

This element structure is basically the same as that of the AlGaAs/GaAs heterojunction bipolar transistor of the first embodiment. In the fourth embodiment, the same effect as in the first embodiment can be obtained. In this case, since a collector consists of Si having a relatively narrow forbidden band, after the entire area of the collector is formed by an n-type layer, the process of increasing the resistance of only an external region by ion implantation cannot be applied to the fourth embodiment. For this reason, an impurity must be doped in the external base region in advance, or a low impurity-concentration layer is used as the external base region to perfectly deplete the external base region to minimize a collector junction capacitance. Therefore, when a semiconductor material such as Si having a narrow forbidden band is used for a collector, the element structure of the fourth embodiment is required. According to the fourth embodiment, since the intrinsic collector region and the external base region can be independently designed, a very high cutoff frequency $f_T$ and a very high maximum oscillation frequency $f_{MAX}$ can be obtained.

Figure 6:
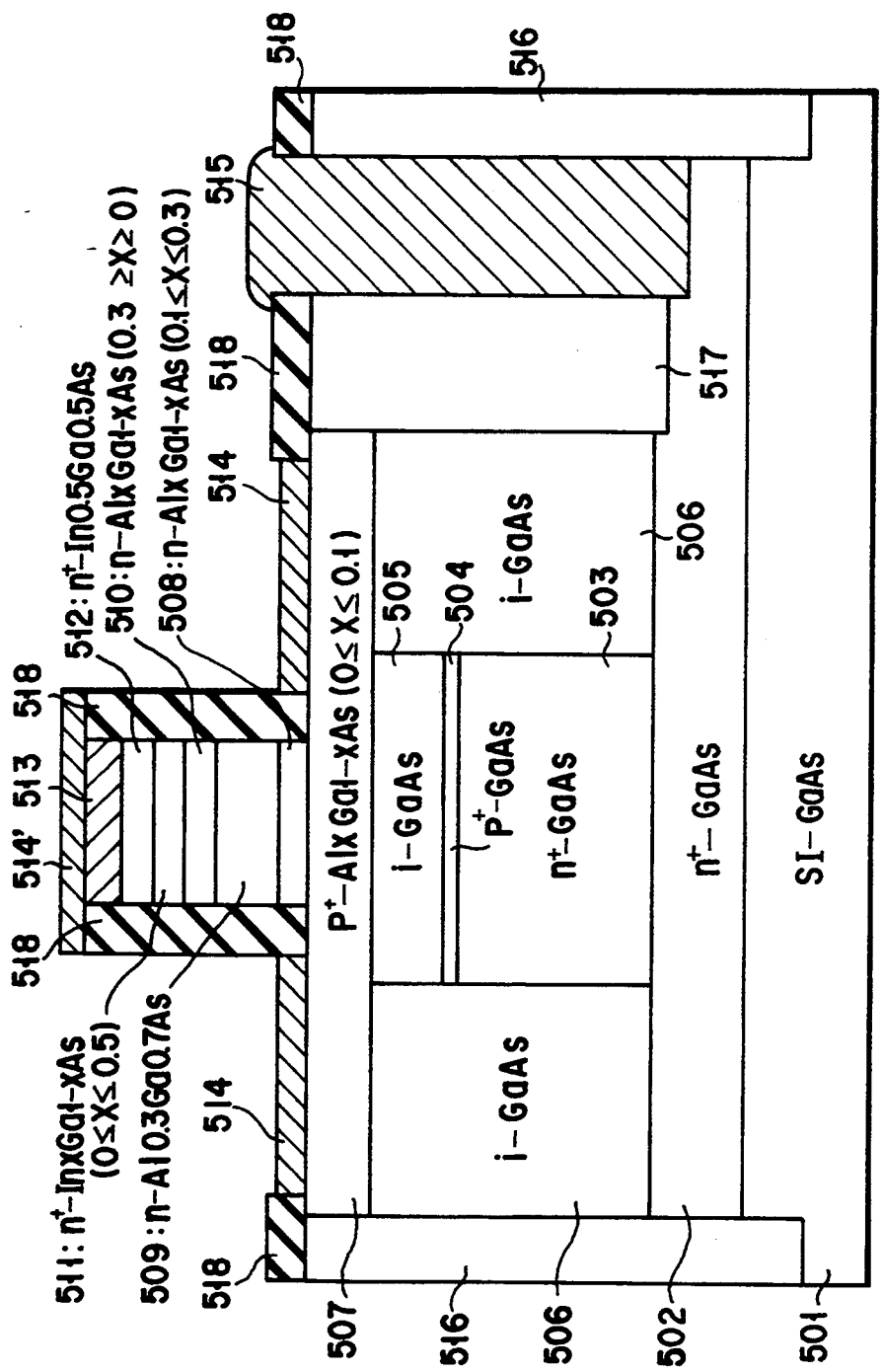
FIG. 6 is a sectional view showing a heterojunction bipolar transistor according to the fifth embodiment of the present invention.

FIG. 6 is a sectional view showing an AlGaAs/GaAs heterojunction bipolar transistor according to the fifth embodiment of the present invention. This transistor is manufactured using the same crystal growth technique as that in the first embodiment.

Figure 7A:
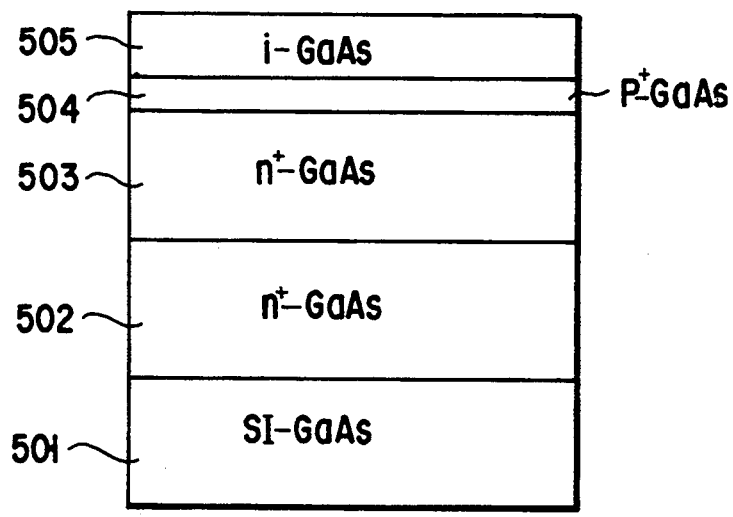

The transistor will be described below according to the manufacturing steps shown in FIGS. 7A to 7D. After an n+-type GaAs sub-collector layer 502 having an impurity concentration of $5 \times 10^{18}$ cm$^{-3}$ and a thickness of 500 nm is formed on a semi-insulating GaAs substrate 501, an 800-nm thick n+-type GaAs collector layer 503 prospectively serving as a first collector layer is formed on the n+-type GaAs sub-collector layer 502, and an i-type GaAs collector layer 505 which serves as a second collector layer, has a thickness of 180 nm, and is not actively doped with an impurity is grown on the resultant structure through a p+-type GaAs layer 504 having an impurity concentration of $1 \times 10^{18}$ cm$^{-3}$ and a thickness of 20 nm and serving as a fourth collector layer (FIG. 7A).

Figure 7B:
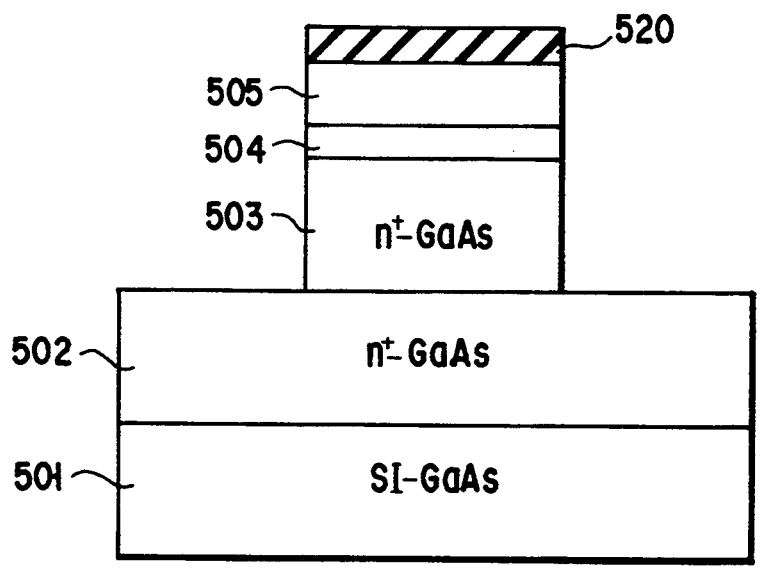

An SiO$_2$ film 520 is deposited on the resultant structure by a CVD method and patterned using a photoresist as a mask. Using the SiO$_2$ film 520 as a mask, anisotropic etching using RIE is performed to reach the n+-type GaAs sub-collector layer 502 so as to remove excessive i-type GaAs, p+-type GaAs, and n+-type and an intrinsic collector region is formed (FIG. 7B). Thereafter, an i-type GaAs collector layer 506 which serves as a third collector layer and is not doped with an impurity is selectively grown using the SiO$_2$ film 520 as a mask to have a thickness of 1,000 nm.

After the SiO$_2$ 510 is remove, a p+-type Al$_x$Ga$_{1-x}$As base layer 507 having an impurity concentration of $1 \times 10^{20}$ cm$^{-3}$ and a thickness of 50 nm is grown. At this time, an Al composition ratio x is gradually changed from 0 to 0.1 from a collector layer side. A uniform base structure in which the ratio x is not changed may also be formed. At this time, although Zn, Mg, Be, or the like can be used as a p-type impurity, carbon (C) which is not easily diffused at a high concentration is preferably used.

An n-type Al$_x$Ga$_{1-x}$As layer 508, an n-type Al$_{0.3}$Ga$_{0.7}$As layer 509, and an n-type Al$_x$Ga$_{1-x}$As layer 510 which serve as an emitter layer are sequentially grown. In this case, since the shape of a conduction band must be smoothly changed to cause electrons to flow, the ratio x in the n-type layer 508 is gradually changed from 0.1 to 0.3 from the base layer side, and the ratio x in the n-type layer 509 is gradually changed from 0.3 to 0. An In$_x$Ga$_{1-x}$As layer 511 and n+-type In$_{0.5}$Ga$_{0.5}$As layer 512 which serve as a cap layer are sequentially grown (FIG. 7C). In this case, in order to smoothly change the shape of the conduction band, an In composition ratio x in the n+-type layer 511 is gradually changed from 0 to 0.5 from the emitter side.

Thereafter, a WSi$_x$ film is deposited by a CVD method to have a thickness of 200 nm and etched by RIE using a photoresist as a mask to pattern an emitter electrode 513 above and inside the intrinsic collector region. In addition, anisotropic etching is performed to the semiconductor layer to reach the n+-type GaAs base layer 507 so as to remove an excessive region. Thereafter, an SiO$_2$ film 518 having a thickness of 300 nm is deposited using plasma CVD, and the SiO$_2$ film 518 is anisotropically etched using RIE to be left around the emitter region having a projection shape (FIG. 7D).

After an opening of the base-collector junction region is formed using a photoresist as a mask, a Cr/Au film is deposited, and a base electrode 514 is formed by lift-off. At the same time, a Cr/Au electrode 514' is formed on the emitter electrode 513. Isolation regions 516 and 517 are formed by H+ion implantation using the photoresist and the SiO$_2$ film as masks, and a collector electrode 515 is formed using AuGe/Ni/Ti/Au, thereby obtaining the bipolar transistor of the present invention.

In the heterojunction bipolar transistor according to the fifth embodiment, since the impurity concentration and thickness of the p+-type layer 504 can be set to appropriate values according to the thickness of the i-type collector layer 505 in the intrinsic transistor region, the inclination of a band can be obtained such that electrons do not almost transit from a Γ band to an L band in the i-type collector layer 505. For this reason, an electron velocity is overshot in almost the entire region of the i-type collector layer, and a collector transit time can be minimized compared with the collector transit time of a normal n-type collector. In the external base region which occupies a large part of a collector junction capacitance, when an i-type layer is perfectly depleted, the junction capacitance is determined by the thickness of the i-type layer. For this reason, when this thickness is sufficiently large, the collector junction capacitance can be minimized. Therefore, according to the fifth embodiment, a very high cutoff frequency $f_T$ and a very high maximum oscillation frequency $f_{MAX}$ can be obtained.

Figure 8:
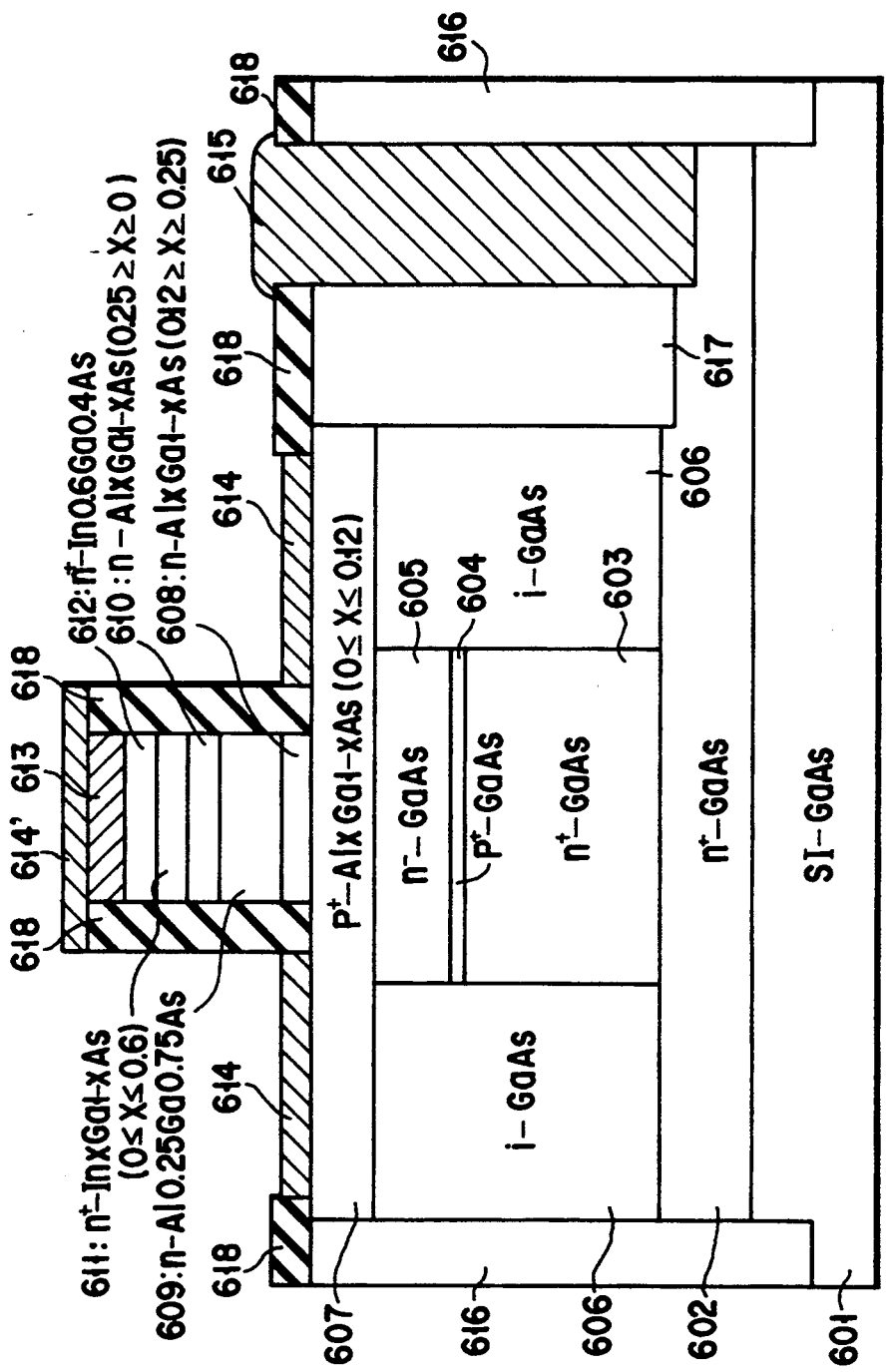
FIG. 8 is a sectional view showing a heterojunction bipolar transistor according to the sixth embodiment of the present invention.

FIG. 8 shows an AlGaAs/GaAs bipolar transistor according to the sixth embodiment of the present invention. Since this transistor has the same basic structure as that of the fifth embodiment, it can be manufactured by the same steps as those of the fifth embodiment.

An n+-type GaAs sub-collector layer 602 is formed on a semi-insulating GaAs substrate 601, and an n+-type GaAs collector layer 603 serving as a first collector layer is formed in an intrinsic transistor region on the n+-type GaAs sub-collector layer 602. An n$^-$-type GaAs collector layer 605 serving as a second collector layer is formed on the n+-type GaAs collector layer 603 through a p+-type GaAs collector layer 604 having a small thickness, and an i-type GaAs collector layer 606 serving as a third collector layer is formed in an external collector region. A p+-type Al$_x$Ga$_{1-x}$As base layer 607 is formed on these collector layers.

An n-type Al$_x$Ga$_{1-x}$As layer 608, an n-type Al$_{0.25}$Ga$_{0.75}$As layer 609, an n-type Al$_x$Ga$_{1-x}$As layer 610, an n+-type In$_x$Ga$_{1-x}$As layer 611, and an n+-type In$_{0.6}$Ga$_{0.4}$As layer 612 are formed as an emitter layer on the base layer.

The sixth embodiment is different from the fifth embodiment in that the i-type collector layer 505 in the intrinsic collector region is replaced with the n$^-$-type collector layer 605. In this case, the impurity concentration and thickness of the n$^-$-type collector layer 605 must be set such that the n$^-$-type collector layer 605 is perfectly depleted in a normal operation condition. The impurity concentration and thickness of the p+-type GaAs layer 604 in the intrinsic collector region have optimal values in relation to the n$^-$-type collector layer 605. With the above layer arrangement, since the depleted n$^-$type collector layer 605 has positive space charges, a base push-out effect can be suppressed in a high injection state, and a high cutoff frequency $f_T$ and a high maximum oscillation frequency $f_{MAX}$ can be simultaneously obtained up to a high current density.

FIG. 9 shows a transistor according to the seventh embodiment of the present invention. Since this transistor has the same basic structure as that of the fifth embodiment, it can be manufactured by the same steps as those of the fifth embodiment.

An n+-type GaAs sub-collector layer 702 is formed on a semi-insulating GaAs substrate 701, and an n+-type GaAs collector layer 703 serving as a first collector layer is formed in an intrinsic transistor region on the n+-type GaAs sub-collector layer 702. An n−-type GaAs collector layer 705 serving as a second collector layer is formed on the n+-type GaAs collector layer 703 through a p+-type GaAs collector layer 704 having a small thickness, and a p-type GaAs collector layer 706 serving as a third collector layer is formed in an external collector region.

A p+-type $Al_xGa_{l-x}As$ base layer 707 is formed on these collector layers. An n-type $Al_xGa_{l-x}As$ layer 708, an n-type $Al_{0.3}Ga_{0.7}As$ layer 709, an n-type $Al_xGa_{l-x}As$ layer 710, an n+-type $In_xGa_{l-x}As$ layer 711, and an n+-type $In_{0.6}Ga_{0.4}As$ layer 712 are formed as an emitter layer on the base layer.

The seventh embodiment is different from the fifth embodiment in that the n−-type collector layer 705 is used in place of the i-type collector layer 505 in the intrinsic collector region and a p−-type collector layer 706 is used in place of the i-type collector layer 506 in the external base region. In this case, the impurity concentrations and thicknesses of the n−-type collector layer 705 and the p−-type collector layer 706 must be set such that the n−-type collector layer 705 and the p−-type collector layer 706 are perfectly depleted in a normal operation state, and the impurity concentration and thickness of the p+-type GaAs layer 704 in the intrinsic collector region have optimal values in relation to the n−-type collector layer 705.

with the above layer arrangement, since the depleted n−-type collector layer 705 has positive space charges, a base push-out effect can be suppressed in a high injection state. Since the p−-type layer is used in the external base region in place of an i-type layer, the potential of the n−-type collector layer 705 in the intrinsic region of the external base region is high with respect to electrons in the n−-type collector layer 705. For this reason, even if the electrons entering from the base to the collector are diffused in the external base region, the electrons are drawn to the intrinsic region due to the potential barrier. Therefore, an increase in collector transit time caused by electrons traveling in the external collector region does not occur.

Figure 10:
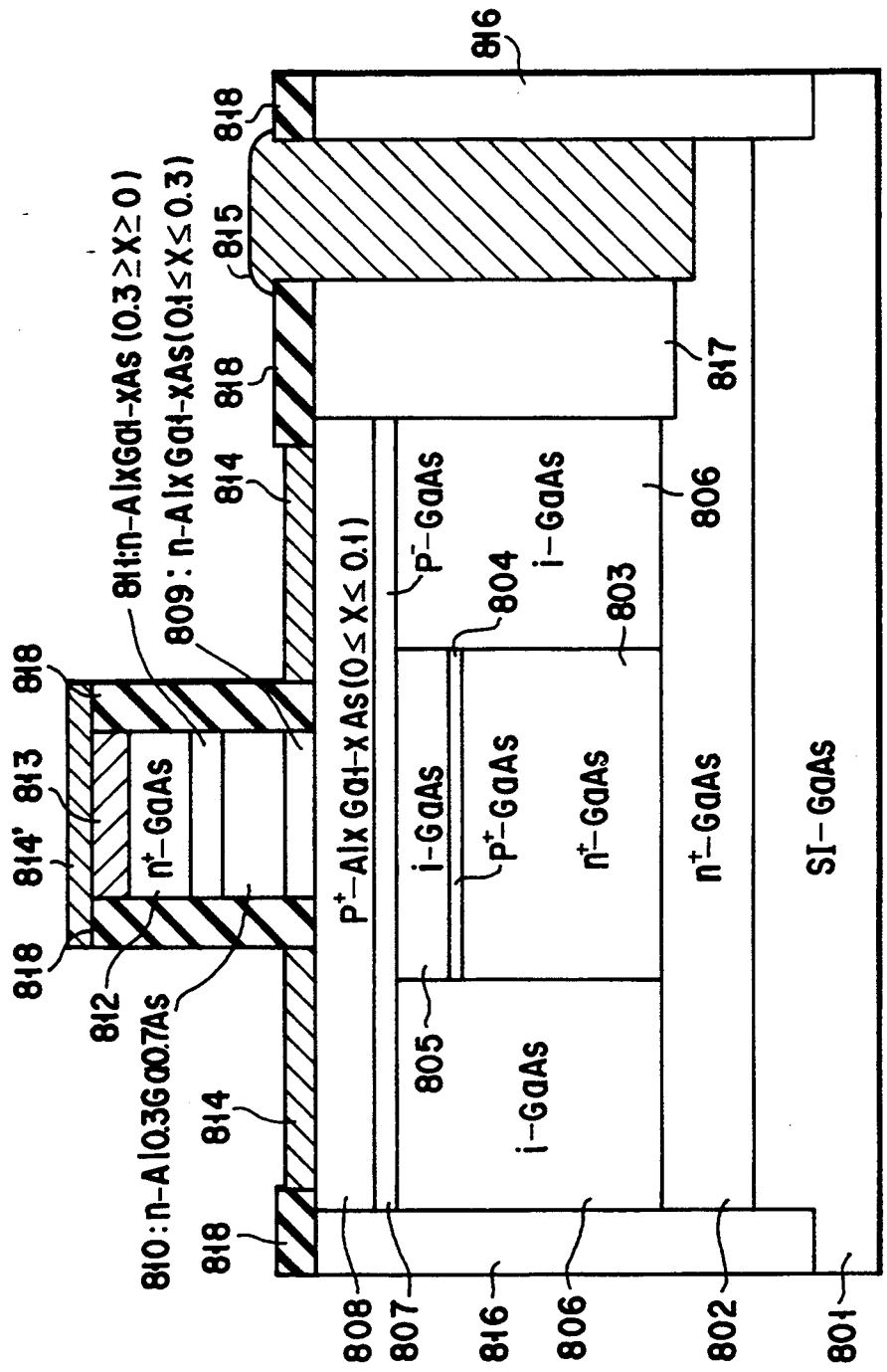
FIG. 10 is a sectional view showing a heterojunction bipolar transistor according to the eighth embodiment of the present invention.

FIG. 10 shows a transistor according to the eighth embodiment of the present invention. Since this transistor has the same basic structure as that of the fifth embodiment, it can be manufactured by the same steps as those of the fifth embodiment.

An n+-type GaAs sub-collector layer 802 is formed on a semi-insulating GaAs substrate 801, and an n+-type GaAs collector layer 803 serving as a first collector layer is formed in an intrinsic transistor region on the n+-type GaAs sub-collector layer 802. An i-type GaAs collector layer 805 serving as a second collector layer is formed on the n+-type GaAs collector layer 803 through a p+-type GaAs layer 804 serving as a fourth collector layer and having a small thickness, and an i-type GaAs collector layer 806 serving as a third collector layer is formed in an external collector region.

A p+-type $Al_xGa_{l-x}As$ base layer 808 is formed on these collector layers through a thin p−-type GaAs layer 807 extending from an intrinsic base region to an external base region. An n-type $Al_xGa_{l-x}As$ layer 809, an n-type $Al_{0.3}Ga_{0.7}As$ layer 810, an n-type $Al_xGa_{l-x}As$ layer 811, and an n+-type GaAs layer 812 are stacked as an emitter layer to have a projection shape.

The eighth embodiment is different from the fifth embodiment by dividing the intrinsic base layer into the p+-type $Al_xGa_{l-x}As$ layer 808 and the p−-type GaAs layer 807 from the emitter side. In this case, a diffusion potential is generated between the p−-type GaAs layer 807 and the p+-type $Al_xGa_{l-x}As$ layer 808 to form an acceleration electric field with respect to electrons entering from the base to the collector. When an i-type collector is in direct contact with a p+-type base, since conduction bands are smoothly connected to each other in the base-collector junction interface, the electrons are gradually accelerated. However, in the structure of the eighth embodiment, since the electrons transit in the collector at a large initial velocity, a collector transit time is shortened compared with a case wherein an initial velocity is small.

Figure 11:
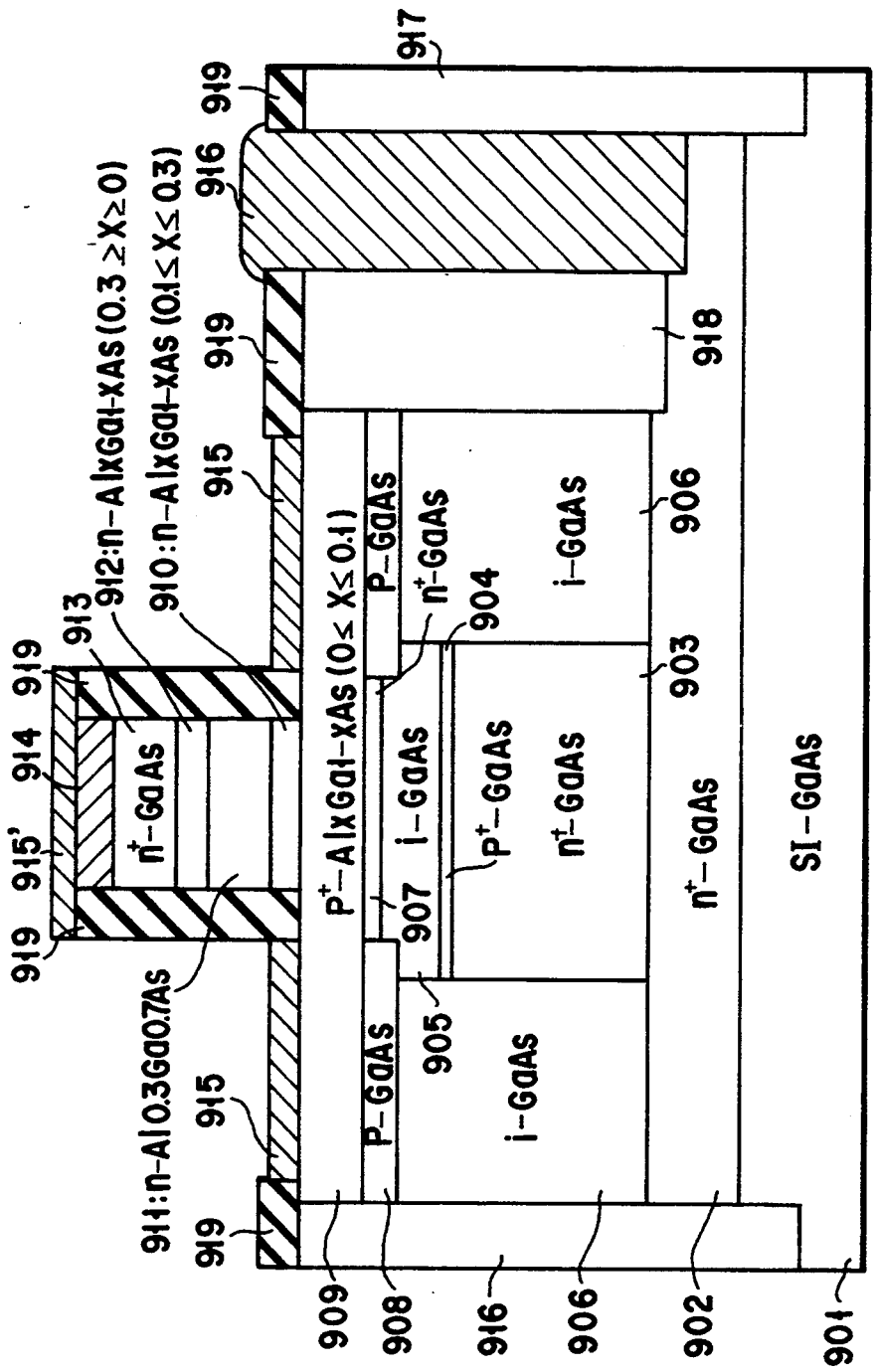
FIG. 11 is a sectional view showing a heterojunction bipolar transistor according to the ninth embodiment of the present invention.

FIG. 11 shows a transistor according to the ninth embodiment of the present invention. Since this transistor has the same basic structure as that of the previous embodiment, it can be manufactured by the same steps as those of the previous embodiment.

An n+-type GaAs sub-collector layer 902 is formed on a semi-insulating GaAs substrate 901, and an n+-type GaAs collector layer 903 serving as a first collector layer is formed in an intrinsic transistor region on the n+-type GaAs sub-collector layer 902. An i-type GaAs collector layer 905 serving as a second collector layer is formed on the n+-type GaAs collector layer 903 through a p+-type GaAs layer 904 serving as a fourth collector layer and having a small thickness, and an i-type GaAs collector layer 906 serving as a third collector layer is formed in an external collector region.

A p+-type $Al_xGa_{l-x}As$ base layer 909 is formed on these collector layers through a thin n+-type GaAs layer 907. A p-type base layer 908 is formed outside the n+-type GaAs layer 907. An n-type $Al_xGa_{l-x}As$ layer 910, an n-type $Al_{0.3}Ga_{0.7}As$ layer 911, an n-type $Al_xGa_{l-x}As$ layer 912, and an n+-type GaAs layer 913 are stacked in an intrinsic base region as an emitter layer.

The ninth embodiment is different from the eighth embodiment in that the n+-type GaAs layer 907 is used in place of the p−-type GaAs layer 807 and the external base region is inverted into the p-type layer 908 by ion implantation or impurity diffusion. In the ninth embodiment, the concentration and thickness of the n+-type GaAs layer 907 are set such that the n+-type GaAs layer 907 is perfectly depleted in a normal operation state, and it is formed for the same purpose as that of the p−-type GaAs layer 807. In addition, the p-type layer 908 is formed to determine the collector junction capacitance of the external base region by only the thickness of a remaining i-type layer. Therefore, the element characteristics of the transistor of the ninth embodiment are almost equal to those of the eighth embodiment.

In each of all the above embodiments, a sub-collector layer having a high concentration is formed as the underlayer of a collector layer, and a collector electrode is extracted from the sub-collector layer. However, in the present invention, the sub-collector layer is not necessarily required, and a collector electrode can be extracted from a first collector layer having a high concentration. Several embodiments having this arrangement will be described below. Since FIGS. 12 to 17 show modifications obtained by modifying the first embodiment, the same reference numerals as in FIG. 1 denote the same parts in FIGS. 12 to 17, and a description thereof will be omitted.

Figure 12:
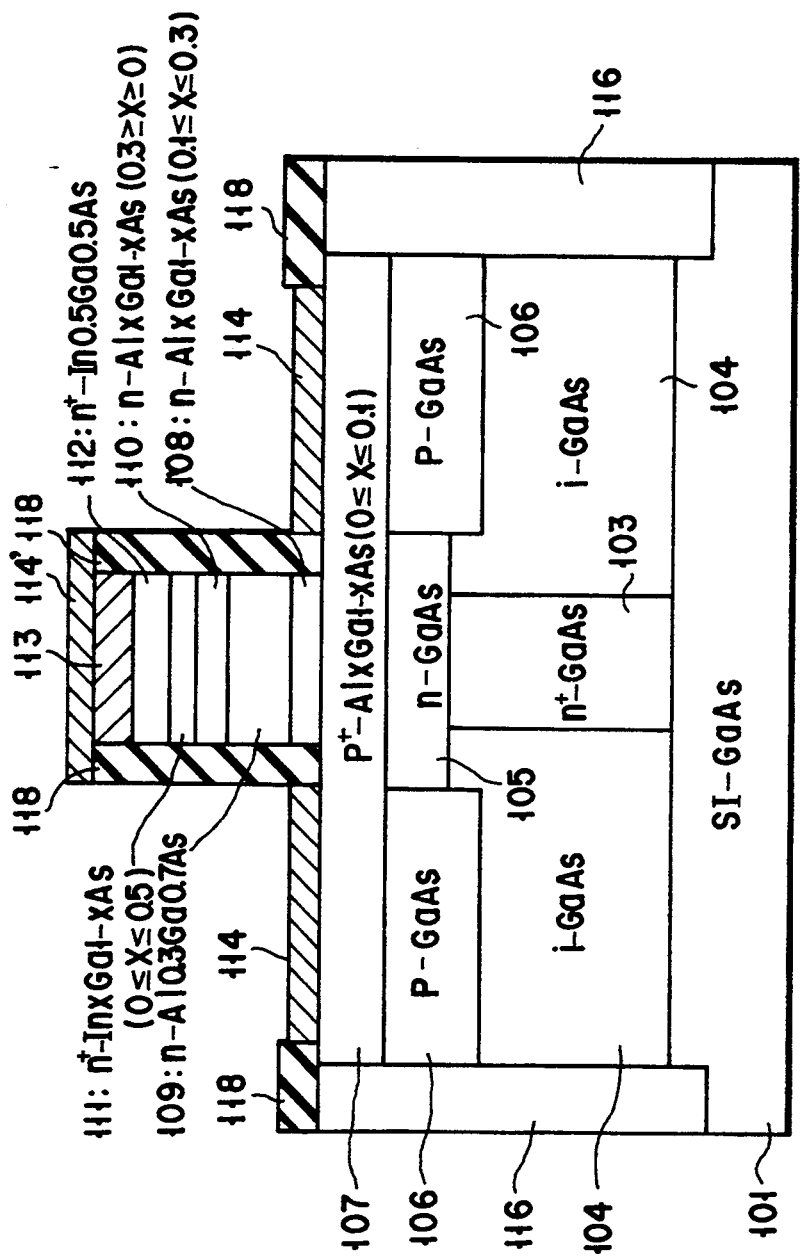
FIG. 12 is a sectional view showing a heterojunction bipolar transistor according to the tenth embodiment of the present invention.

FIG. 12 shows the tenth embodiment in which a sub-collector layer 102 is omitted on the basis of the first embodiment of FIG. 1. In this case, an n+-type GaAs collector layer 103 having a high concentration extends outside the element region in the vertical direction of FIG. 12 to extract a collector electrode.

FIG. 13 shows the layout showing a structure for extracting the collector electrode. FIG. 12 shows a section along a line XII—XII in FIG. 13. As indicated by broken lines, the n+-type GaAs collector layer 103 extends outside the element region and is patterned such that a collector electrode 115 is brought into contact with the n+-type GaAs collector layer 103 outside the element region. Although the collector electrode is extracted from one side in FIG. 13, collector electrodes can be extracted from both sides.

Figure 14:
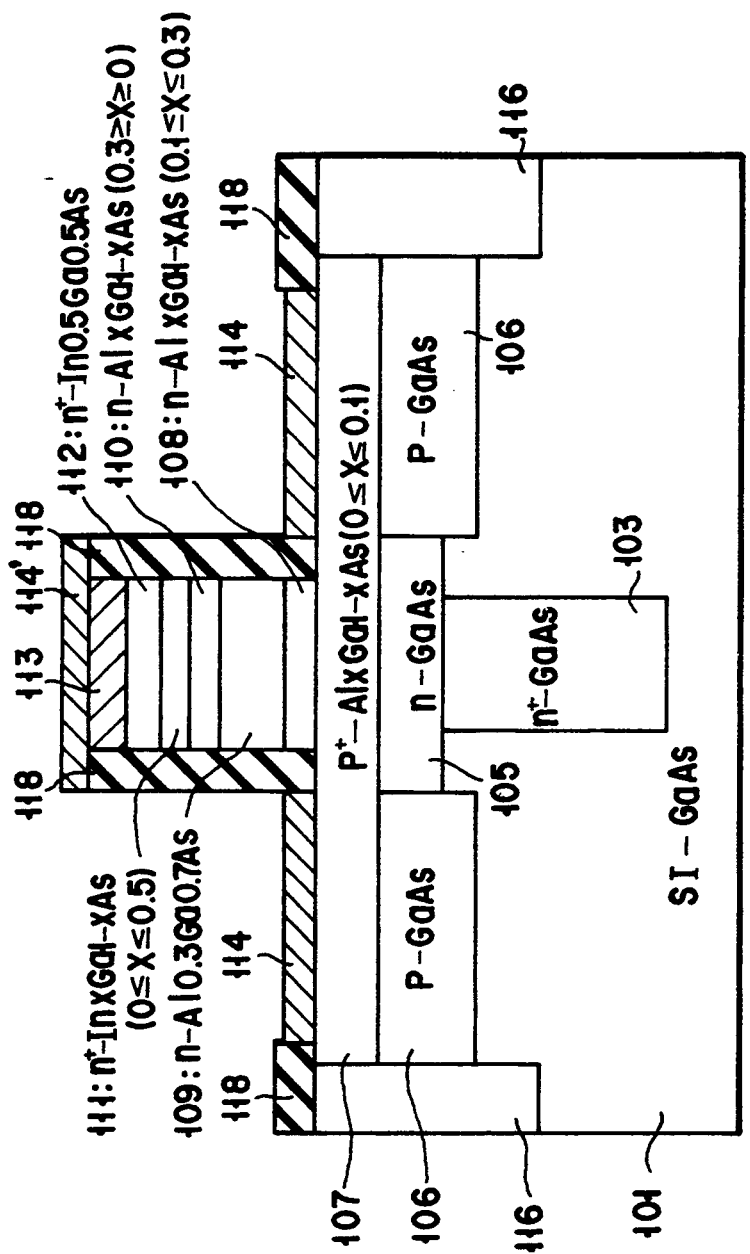
FIG. 14 is a sectional view showing a heterojunction bipolar transistor according to the eleventh embodiment of the present invention.

Similarly, FIG. 14 shows the eleventh embodiment which has no sub-collector layer and is obtained by modifying the first embodiment in FIG. 1. In the eleventh embodiment, a semi-insulating GaAs substrate 101 is used as an i-type GaAs collector layer 104 serving as the third collector layer in FIG. 1. This structure is obtained such that a groove is formed in the semi-insulating GaAs substrate 101, and an n+-type GaAs collector layer 103 is buried in the groove. A collector electrode is extracted in the same manner as in the tenth embodiment.

Figure 15:
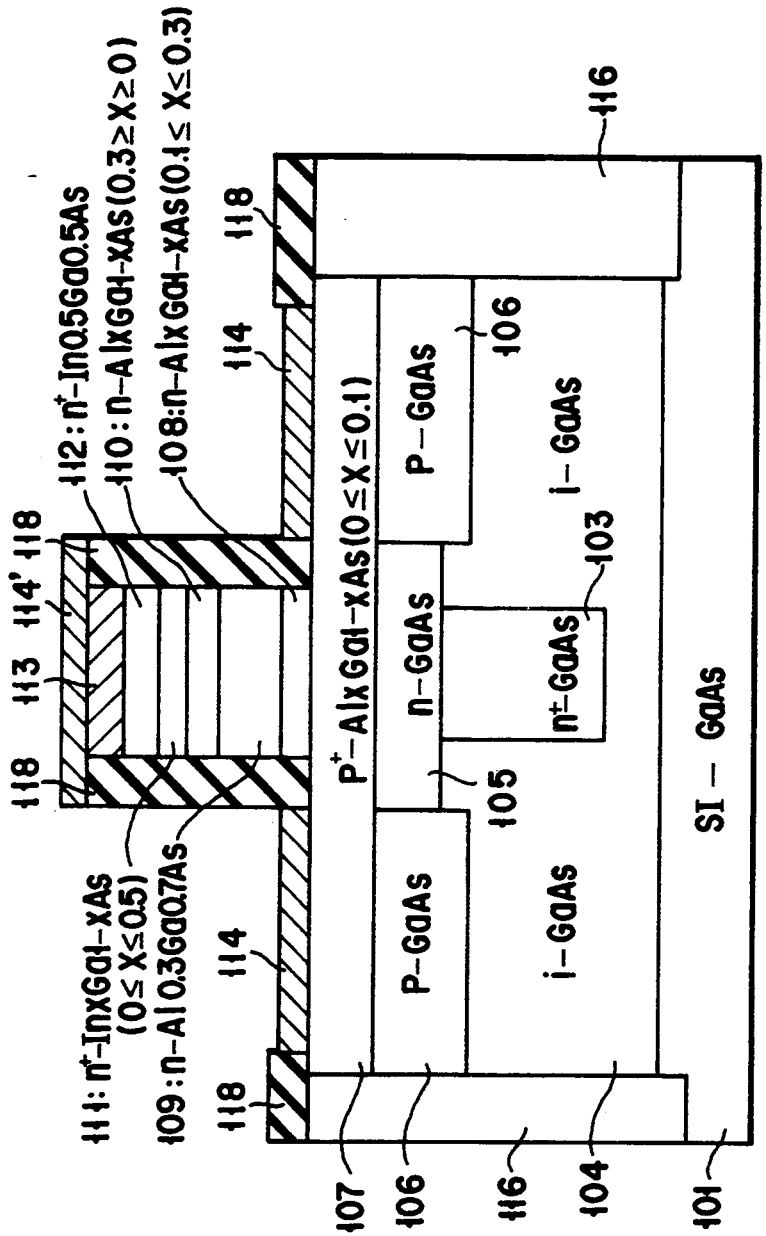
FIG. 15 is a sectional view showing a heterojunction bipolar transistor according to the twelfth embodiment of the present invention.

Similarly, FIG. 15 shows the twelfth embodiment which has no sub-collector layer and is obtained by modifying the first embodiment in FIG. 1. In the twelfth embodiment, after an i-type GaAs collector layer 104 serving as a third collector layer is grown on the entire surface of a semi-insulating GaAs substrate 101, the i-type GaAs collector layer 104 is etched to form a groove, and, as in the embodiment of FIG. 14, an n+-type GaAs collector layer 103 is buried in the groove. In this embodiment, a collector electrode is extracted in the same manner as in the tenth embodiment.

Although the embodiments described in FIGS. 12 to 15 are based on the element structure in the first embodiment, the modifications in FIGS. 12 to 15 can be used in the embodiments from FIG. 3.

In the embodiments in FIGS. 12 to 15, the n+-type GaAs collector layer 103 can be formed by a stacked structure consisting of an n+-type InGaAs layer having a sufficiently high concentration and an n+-type GaAs layer to obtain a preferable collector electrode contact. In this case, in order to smoothly transit a bandgap, a bandgap transit layer is preferably formed between the GaAs layer and the InGaAs layer as in the emitter region.

In the layout in FIG. 13, the base electrode 114 overlaps the n+-type GaAs collector layer 103 in a hatched area a. This is a reason for increasing a collector-base capacitance. In order to improve this point, the base electrode is extracted through over the emitter electrode.

Figure 16:
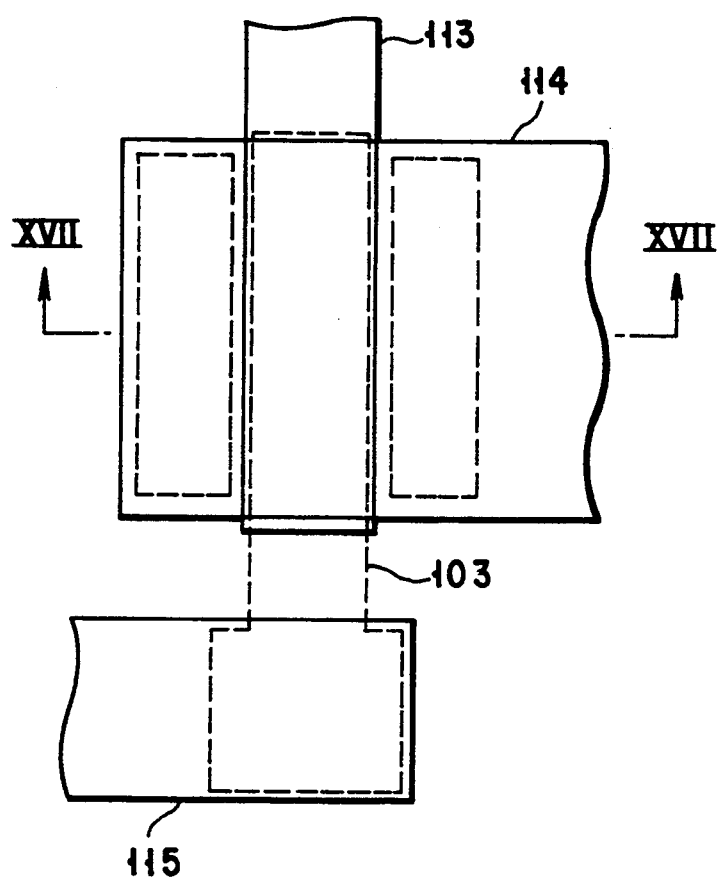
FIG. 16 shows the layout of a modification of the embodiment in FIG. 13.
Figure 17A:
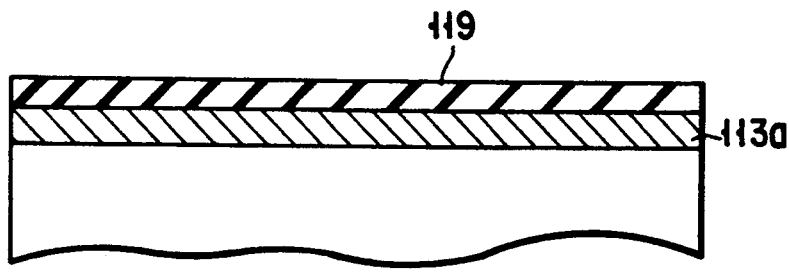
FIGS. 17A to 17C are views showing a manufacturing process for obtaining the electrode structure in FIG. 16.
Figure 17B:
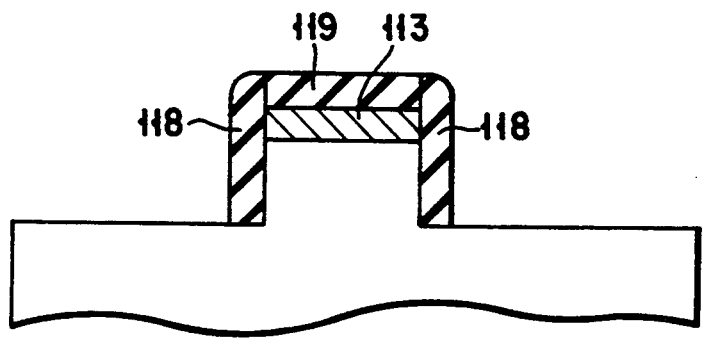
Figure 17C:
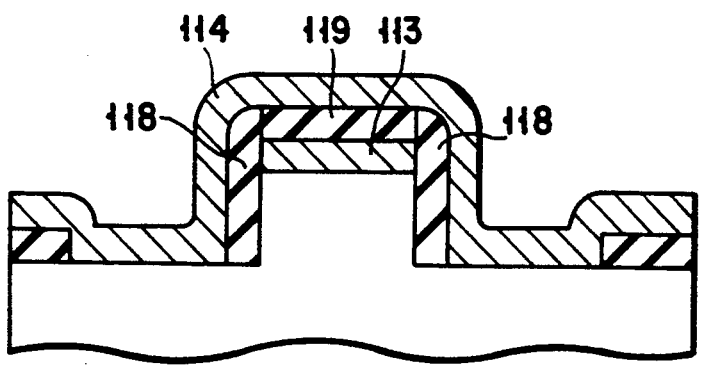
Figure 18:
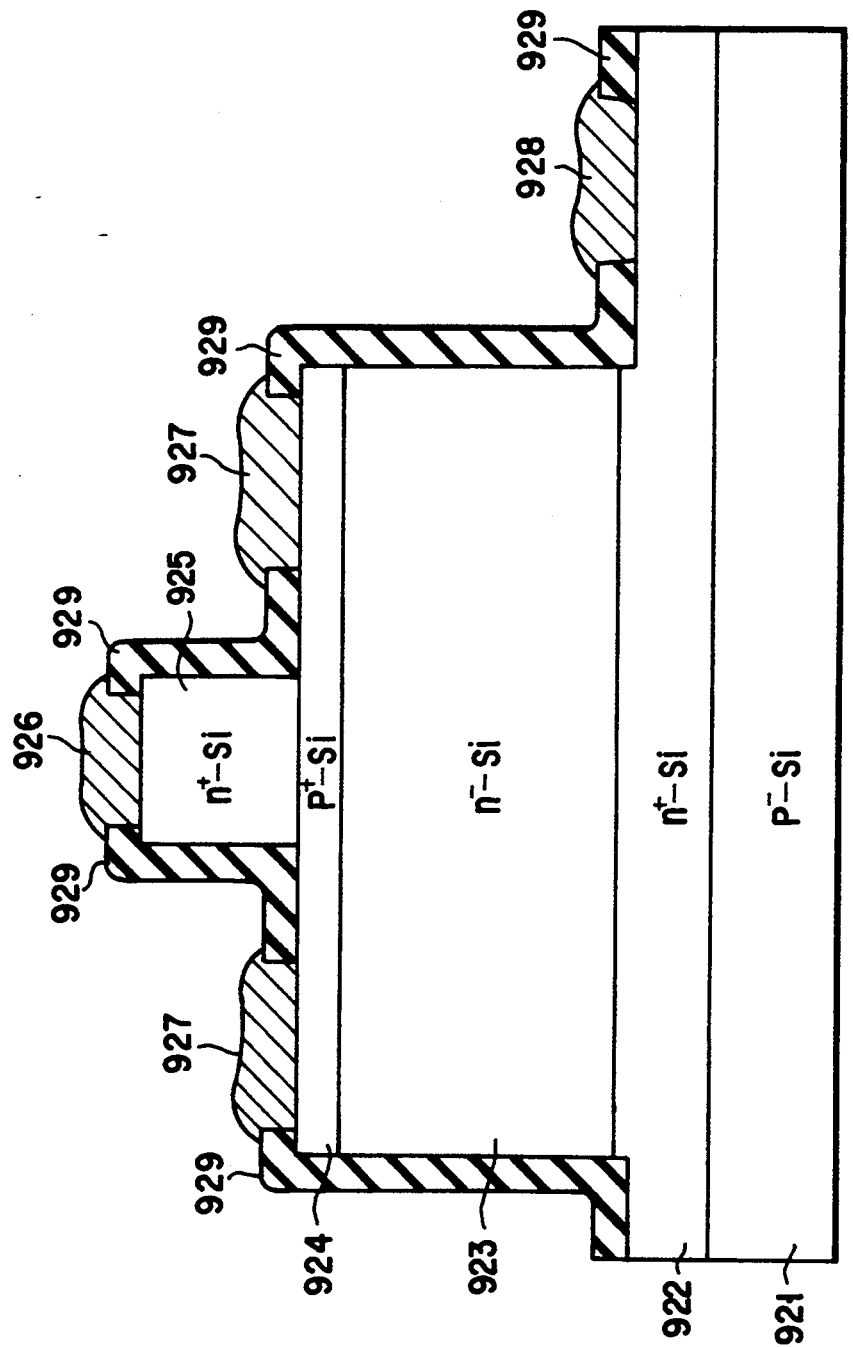
FIG. 18 is a sectional view showing a conventional homojunction bipolar transistor.
Figure 19:
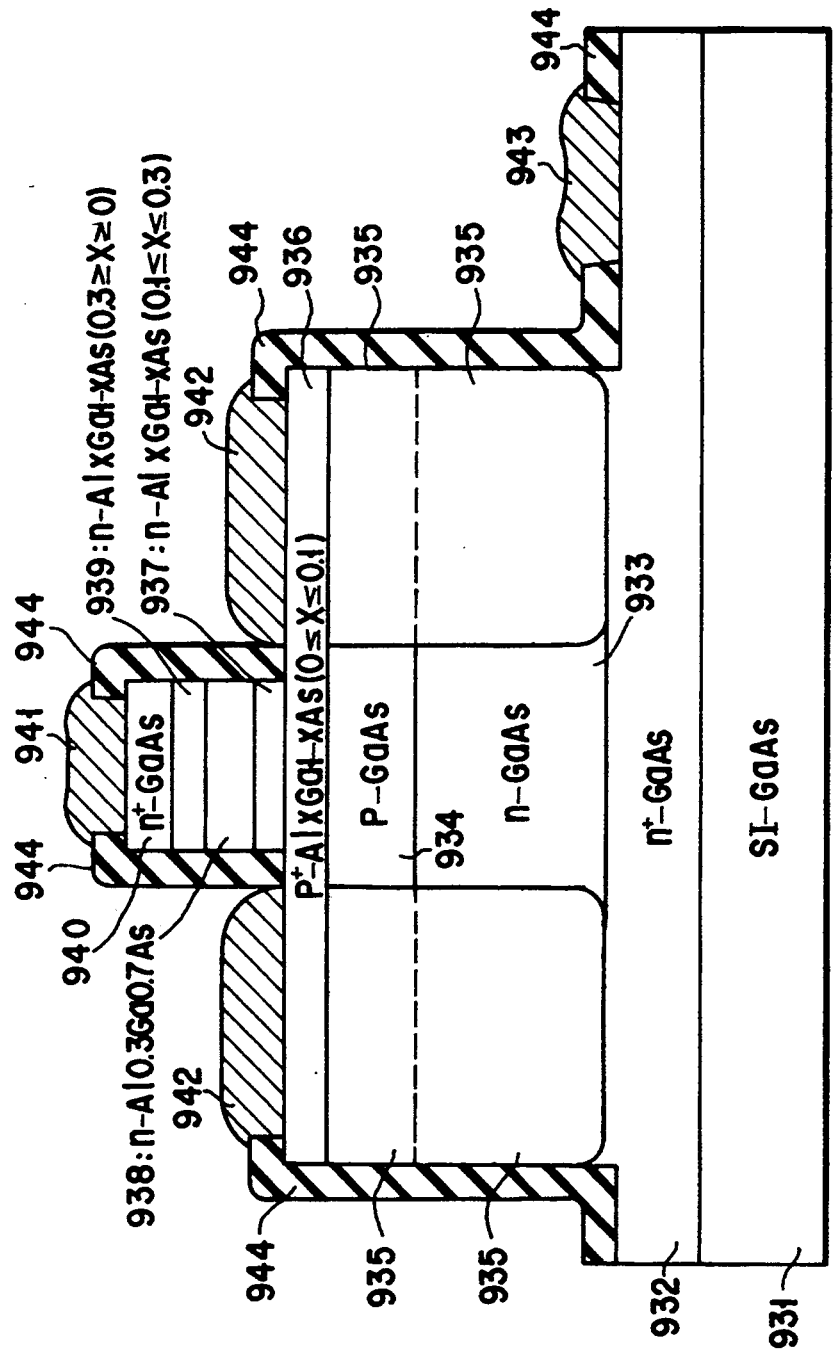
FIG. 19 is a sectional view showing a conventional heterojunction bipolar transistor.
Figure 20:
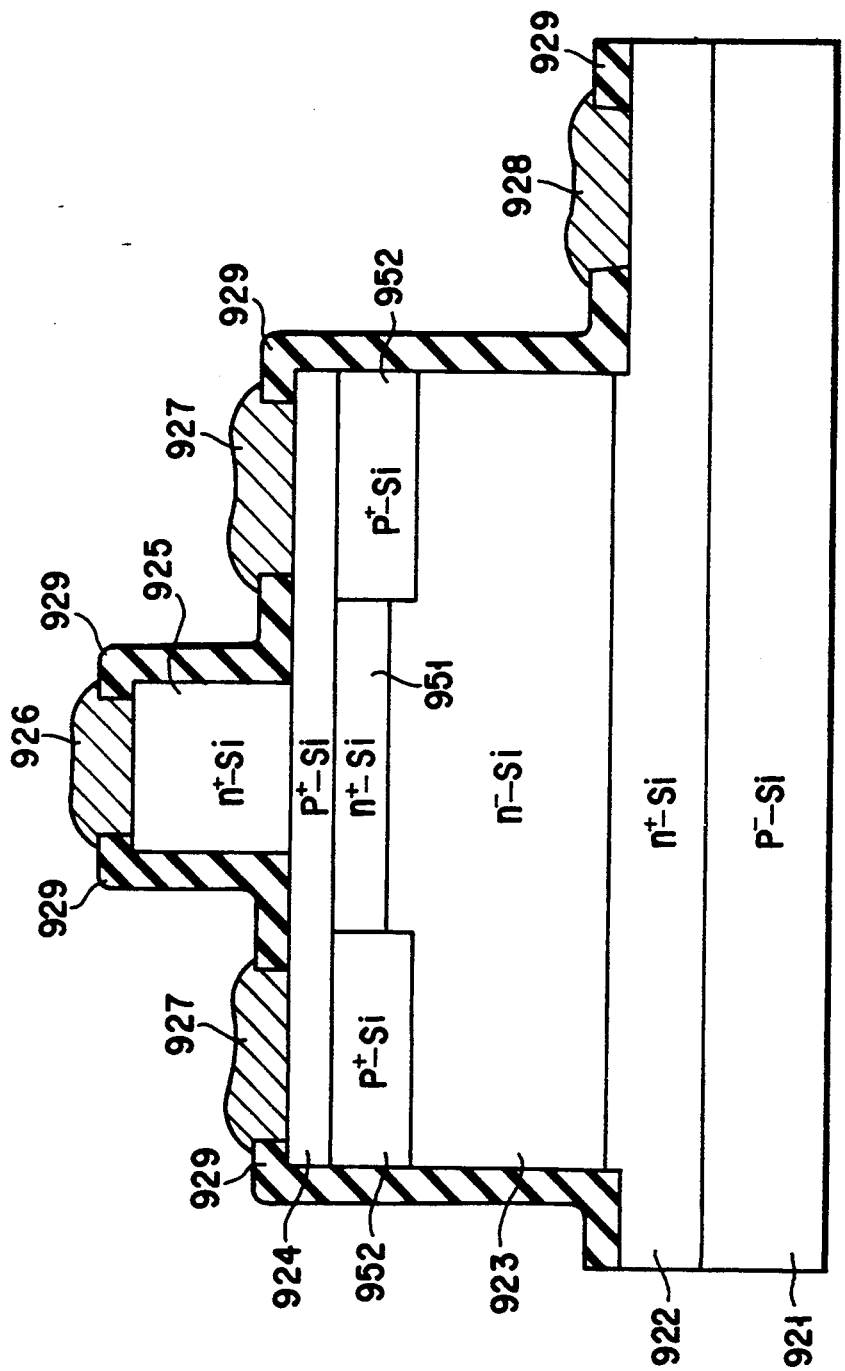
FIG. 20 is a sectional view showing another conventional homojunction bipolar transistor.
Figure 21:
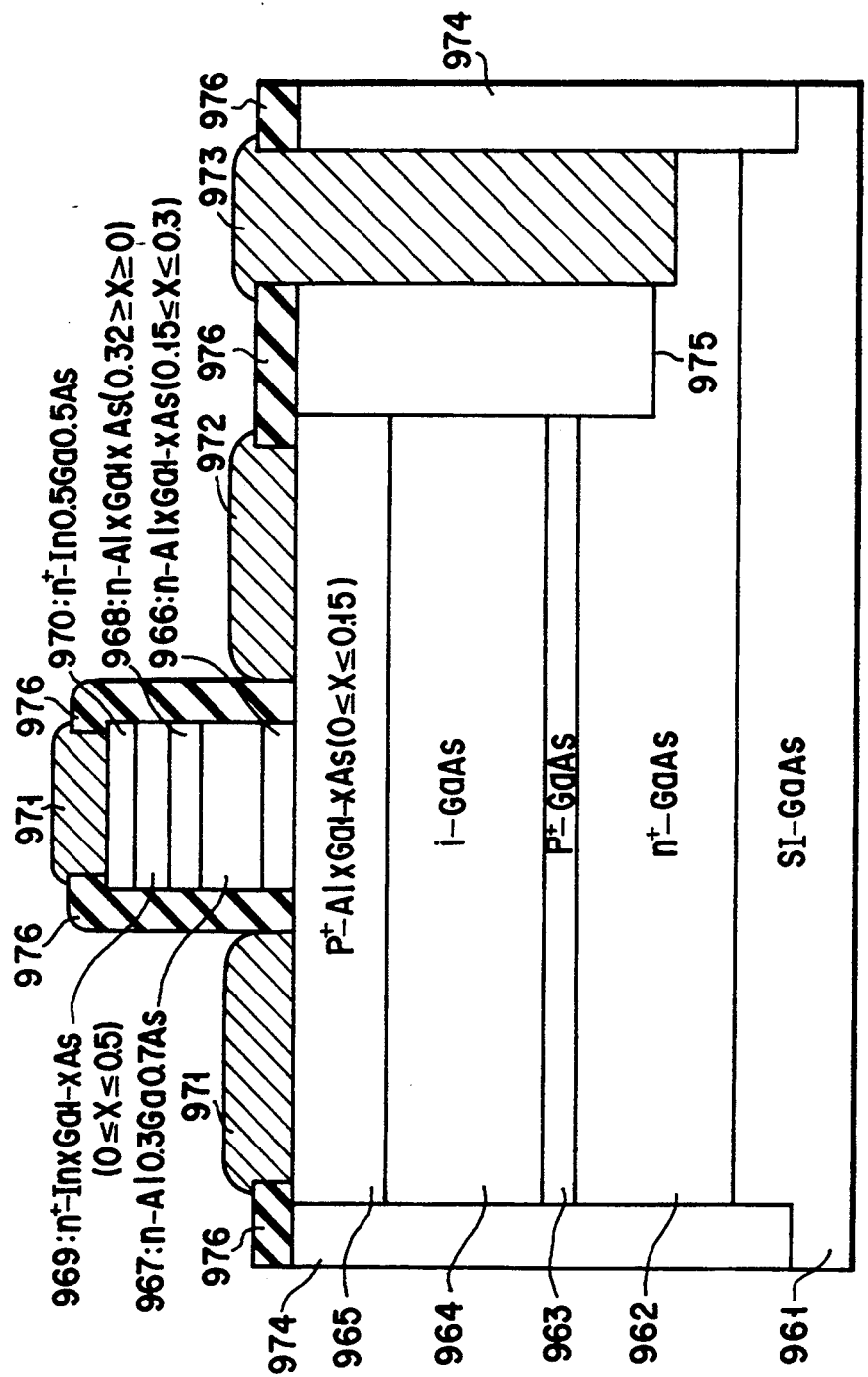
FIG. 21 is a sectional view showing another conventional heterojunction bipolar transistor.

FIG. 16 shows this electrode layout corresponding to FIG. 13. FIGS. 17A to 17C show a manufacturing process on the section along an XVII—XVII line in FIG. 16 when this electrode layout is used. As shown in FIG. 17A, for example, a WN film 113a serving as an emitter electrode is formed on the entire surface of a substrate, and a silicon oxide film 119 is deposited on the WN film 113a. Thereafter, as shown in FIG. 17B, the silicon oxide film 119 is patterned, and the WN film 113a is selectively etched using the silicon oxide film 119 as a mask to form an emitter electrode 113. Subsequently, a semiconductor layer is selectively etched to form a projected emitter layer and to expose an external base region. A silicon oxide film 118 is formed on a side wall of the emitter layer. When the silicon oxide film 119 covering the emitter electrode is left during the above operation, as shown in FIG. 17C, a base electrode 114 can be formed to jump over the emitter electrode 113.

The embodiments of bipolar transistors having AlGaAs/GaAs and SiGe/Si heterojunctions have been described above. However, when other materials, e.g., a heterojunction consisting of group III-V compound semi-conductors such as InAlAs/InGaAs, InP/InGaAsP, and InGaAs/GaSbAs, a heterojunction consisting of group IV semiconductors such as SiC/Si, a heterojunction consisting of group II-VI compound semiconductors such as HgCdTe/CdTe, and a heterojunction consisting of group III-V and IV semiconductors such as GaP/Si and GaAs/Ge, are used, the present invention can be applied. In addition, the present invention can be applied to a bipolar transistor using polysilicon as the material an emitter.

Although heterojunction bipolar transistors are exemplified by all the embodiments, the present invention can be effected to a normal bipolar transistor in which a heterojunction is not used.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A bipolar transistor comprising:
   a substrate;
   a first collector layer of a first conductivity type having a high carrier concentration and formed only in an intrinsic transistor region defined on said substrate;
   a second collector layer of the first conductivity type having a carrier concentration lower than that of said first collector layer and formed on said first collector layer;
   a third collector layer having a high resistance and formed to surround said first collector layer;
   a collector electrode connected to said first collector layer;
   an external base layer of a second conductivity type formed on said third collector layer to surround said second collector layer;
   a main base layer of the second conductivity type having a carrier concentration higher than that of said external base layer and formed on said external base layer and said second collector layer, said second collector layer being interposed between said first collector layer and said main base layer;
   a base electrode connected to said main base layer;

an emitter layer of the first conductivity type formed only in said intrinsic transistor region on said main base layer; and an emitter electrode connected to said emitter layer;

wherein when plan view areas of said first collector layer, said second collector layer, and said emitter layer are represented by $S_{C1}$, $S_{C2}$, and $S_E$, respectively, conditions of $S_{C1}<S_{C2}$ and $S_{C2}<S_E$ are satisfied, and said external base layer is arranged so as not to contact said first collector layer.

2. A transistor according to claim 1, wherein said external base layer and said second collector layer have upper surface, respectively, which are aligned with each other.

3. A transistor according to claim 1, further comprising a fourth collector layer of the second conductivity type having a carrier concentration lower than that of said main base layer, and formed between said second collector layer and said main base layer so as to be surrounded by said external base layer.

4. A transistor according to claim 1, wherein, when thicknesses of said second collector layer and said external base layer are represented by $d_{C2}$ and $d_{B2}$, respectively, a condition of $d_{C2} \leq d_{B2}$ is satisfied.

5. A transistor according to claim 1, wherein said second collector layer comprises a first portion of the first conductivity type having a high carrier concentration and a second portion of the first conductivity type having a low carrier concentration, and said first and second portions are arranged on sides of said first collector and main base layer, respectively.

6. A transistor according to claim 1; further comprising a sub-collector layer of the first conductivity type having a high carrier concentration and formed between said substrate and said first collector layer, and said first collector layer being connected to said collector electrode through said sub-collector layer.

7. A transistor according to claim 1, wherein said intrinsic transistor region has a substantially rectangular shape in plan view, said main base layer and said base electrode are in direct contact with each other near and outside a first side of said rectangular shape, and said first collector layer and said collector electrode are in direct contact with each other near and outside a second side perpendicular to the first side of said rectangular shape.

8. A transistor according to claim 7, wherein said substrate consists of a semi-insulating semiconductor, and said third collector layer consists of a part of said substrate.

9. A transistor according to claim 7, wherein an insulating film is formed on said emitter electrode, and a part of said base electrode passes over said insulating film.

10. A bipolar transistor comprising:

a substrate;

a first collector layer of a first conductivity type formed in an intrinsic transistor region defined on said substrate and having a high carrier concentration;

a second collector layer of a second conductivity type having a high carrier concentration and formed on said first collector layer;

a third collector layer of the first conductivity type having a carrier concentration lower than that of said first collector layer and formed on said second collector layer;

a fourth collector layer having a high resistance and formed to surround said first, second and third collector layers;

a collector electrode connected to said first collector layer;

a base layer of a second conductivity type formed on said third and fourth collector layer;

a base electrode connected to said base layer;

an emitter layer of the first conductivity type formed only in said intrinsic transistor region on said base layer; and an emitter electrode connected to said emitter layer.

11. A transistor according to claim 10, wherein said fourth collector layer comprises an undoped intrinsic semiconductor layer.

12. A transistor according to claim 10, wherein said fourth collector layer comprises a layer of the second conductivity type having a low carrier concentration.

13. A transistor according to claim 10, wherein said third collector layer comprises a first portion of undoped intrinsic semiconductor, and a second portion of the first conductivity type having a high carrier concentration.

14. A transistor according to claim 10, further comprising a sub-collector layer of the first conductivity type having a high carrier concentration and formed between said substrate and said first collector layer, said first collector layer being connected to said collector electrode through said sub-collector layer.

15. A transistor according to claim 10, wherein said intrinsic transistor region has a substantially rectangular shape in plan view, said base layer and said base electrode are in direct contact with each other near and outside a first side of said rectangular shape, and said first collector layer and said collector electrode are in direct contact with each other near and outside a second side perpendicular to the first side of said rectangular shape.

16. A transistor according to claim 15, wherein an insulating film is formed on said emitter electrode, and a part of said base electrode passes over said insulating film.

* * * * *